US006852469B2

(12) United States Patent
Endo

(10) Patent No.: US 6,852,469 B2
(45) Date of Patent: Feb. 8, 2005

(54) LITHOGRAPHIC PRINTING PLATE PRECURSOR

(75) Inventor: Akihiro Endo, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 49 days.

(21) Appl. No.: 10/270,599

(22) Filed: Oct. 16, 2002

(65) Prior Publication Data

US 2003/0113666 A1 Jun. 19, 2003

(30) Foreign Application Priority Data

Oct. 16, 2001 (JP) .................................... P. 2001-318084

(51) Int. Cl.[7] ................................................ G03F 7/004
(52) U.S. Cl. ..................... 430/272.1; 430/138; 430/964
(58) Field of Search ............................. 430/138, 270.1, 430/272.1, 281.1, 964

(56) References Cited

U.S. PATENT DOCUMENTS

| | | | | |
|---|---|---|---|---|
| 6,230,621 B1 | | 5/2001 | Verschueren et al. | |
| 6,455,222 B1 | * | 9/2002 | Fukino et al. | 430/270.1 |
| 6,653,042 B1 | * | 11/2003 | Fukino et al. | 430/270.1 |
| 2003/0061957 A1 | * | 4/2003 | Kasai | 101/463.1 |

FOREIGN PATENT DOCUMENTS

| | | | | | |
|---|---|---|---|---|---|
| EP | 0 976 549 A1 | | 2/2000 | |
| EP | 1 038 666 A2 | * | 9/2000 | B41C/1/10 |
| EP | 1 057 622 A2 | * | 12/2000 | B41C/1/10 |
| JP | 7-1849 | | 1/1995 | |
| JP | 7-1850 | | 1/1995 | |
| JP | 10-6458 | | 1/1998 | |
| JP | 11-70756 | | 3/1999 | |

OTHER PUBLICATIONS

Research Disclosure No. 33303 (Jan. 1992), 2 pages.

* cited by examiner

*Primary Examiner*—Barbara L. Gilliam
(74) *Attorney, Agent, or Firm*—Sughrue Mion, PLLC

(57) ABSTRACT

A lithographic printing plate precursor comprises a support and a hydrophilic layer capable of hydrophobicizing by heat, wherein the hydrophilic layer comprises:
- a particulate hydrophobicizing precursor;
- a photo-heat converting agent;
- a hydrophilic polymer having a silane coupling group, and
- a metal complex catalyst.

8 Claims, No Drawings

LITHOGRAPHIC PRINTING PLATE PRECURSOR

FIELD OF THE INVENTION

The present invention relates to a nondevelopment negative-working lithographic printing plate precursor having an image-forming hydrophilic layer provided on a support. More particularly, the invention relates to a lithographic printing plate precursor which allows image recording by scanning with infrared rays on the basis of digital signal and, once subjected to image recording, can be directly used in printing free from development.

BACKGROUND OF THE INVENTION

Many studies have been made of computer-to-plate printing plate, which has been remarkably developed in recent years. Under these circumstances, aiming at further process rationalization and solution to waste liquid problems, a lithographic printing plate precursor which can be mounted on the printing machine free from development after exposure for printing purpose and a lithographic printing plate precursor which can be exposed to light on the printing machine shortly before printing have been studied. Various related methods have been proposed.

For example, Japanese Patent 2,938,397, Japanese Patent Laid-Open No. 1997-127683 and WO99-10186 disclose a heat-sensitive lithographic printing plate precursor comprising a hydrophilic image-forming layer having a particulate thermoplastic polymer dispersed in a matrix such as hydrophilic resin provided on a substrate having a hydrophilic surface. These patents disclose that the conventional development process involving the use of an automatic developing machine can be omitted by using a method (on-the-machine development method) which comprises removing unheated area as if it has been developed, i.e., applying heat to the image-forming layer by exposure to infrared rays or the like so that the particulate thermoplastic polymer undergoes melt-coalescence to convert the surface of the hydrophilic image-forming layer to a hydrophilic image area, mounting the lithographic printing plate having this image area formed thereon on the printing machine, and then supplying fountain solution and ink onto the printing plate while rotating the plate cylinder.

Further, Japanese Patent Laid-Open No. 2000-238452 discloses that a lithographic printing material comprising a microgel having a group which decomposes by at least one of heat and heat energies on the surface thereof and an infrared-absorbing agent incorporated in an image-forming layer can be subjected to development on the printing machine.

However, the aforementioned on-the-machine type unprocessed lithographic printing plate precursor is disadvantageous in that it requires much cost and time. For example, since the removal of the unexposed area is governed by the conditions under which the printing machine begins to operate and the material containing much hydrophilic components thus removed contaminate water roller and fountain solution, scores or hundreds of sheets need to be wasted until good printed matters are obtained or the roller must be cleaned.

Research Disclosure No. 33303, January 1992, discloses a heat-sensitive lithographic printing plate precursor having a heat-sensitive layer comprising a particulate thermoplastic polymer dispersed in a crosslinked hydrophilic resin. Further, Japanese Patent Laid-Open No. 1995-1849, Japanese Patent Laid-Open No. 1995-1850, Japanese Patent Laid-Open No. 1998-6458 and Japanese Patent Laid-Open No. 1999-70756 disclose a heat-sensitive lithographic printing plate precursor having a hydrophilic layer comprising microcapsules having a hydrophilic component encapsulated therein as hydrophilic particles dispersed in a crosslinked hydrophilic binder polymer. It is also disclosed that these heat-sensitive lithographic printing plate precursors comprise as a printing surface a surface composed of a hydrophilic image area formed by heat developed by exposure and an unexposed hydrophilic non-image area and thus require no development on the printing machine, allowing lithographic printing with fountain solution without processing.

However, the aforementioned related art lithographic printing plate precursor which requires no processing leaves something to be desired in stain resistance during printing and press life.

It is known that a particulate metal oxide (e.g., $siO_2$, $TiO_2$) is used as a hydrophilic material to improve background stain resistance. Japanese Patent Laid-Open No. 2000-79771 discloses the use of a particulate metal having a size of not greater than 100 nm. This particulate metal is sufficiently hydrophilic on the inorganic surface thereof and has an enhanced surface roughness and hence a raised water retention to improve the background stain resistance of the lithographic printing plate precursor. On the other hand, however, a film containing a metal oxide dispersion is subject to cracking (fine cracking occurring during drying). An ordinary method for preventing the occurrence of cracking is to add PVA (polyvinyl alcohol) as a binder. However, the use of PVA causes deterioration of hydrophilicity, causing the lithographic printing plate precursor subject to background stain when it is squeezed out of fountain solution. Therefore, it is the status of quo that no methods have been obtained for obtaining a sufficient hydrophilicity free from adverse effects on the physical properties of film.

The inventors made studies of solution to these problems. As a result, it was found that the combined use of a hydrophilic polymer terminated by a silane coupling group and a particulate metal oxide causes the hydrophilic polymer to be selectively grafted on the surface of the printing plate precursor, making it possible to prevent the occurrence of background stain. It was further found that the film of hydrophobicizing resin particle which has been converted to a hydrophilic image area by heating can be kept ink-receptive and exhibits an excellent press life. However, since a dehydration condensation reaction is employed to harden the hydrophilic polymer-containing binder layer having a silane coupling group (silica sol-gel), a certain acidic catalyst or basic catalyst is required to obtain a highly hydrophilic and hard microphase separation structure. When an acidic or basic catalyst is added to the coating solution to an extent such that a catalytic effect can be exerted, it is disadvantageous in that the age stability of the coating solution is deteriorated or the conditions of the coated surface are defective (deterioration of smoothness).

As shown in the aforementioned background of the related art technique, an attempt to satisfy excellent press life and print quality such as background stain resistance resulted in disadvantages of coat quality such as drop of producibility such as age stability of coating solution and smoothness of coated surface. Satisfactory status of quo have never been reached.

SUMMARY OF THE INVENTION

The invention has been worked out under these circumstances to solve the aforementioned problems. In other words, an aim of the invention is to provide a lithographic printing plate precursor which allows printing without development after exposure, exhibits an excellent press life, causes little background stain and gives improvements in the stability of coating solution and the surface conditions of coat layer.

The inventors made extensive studies of these problems paying their attention to the behavior of silica-based coat-forming material in coating solution and the silica sol-gel reaction process of the silica-based coat-forming material in the coat layer during the production of printing plate precursor, particularly to the kind and amount of catalyst in the sol-gel reaction. As a result, it was found that there is a catalyst which doesn't cause the aforementioned producibility and the use of such a catalyst makes it possible to attain the aforementioned aim. The invention has the following constitutions.

(1) A lithographic printing plate precursor comprising a support and a hydrophilic layer capable of hydrophobicizing by heat, wherein the hydrophilic layer comprises:

- a particulate hydrophobicizing precursor;
- a photo-heat converting agent;
- a hydrophilic polymer having a silane coupling group, and
- a metal complex catalyst.

(2) The lithographic printing plate precursor according to the item (1), wherein the metal complex catalyst is a metal complex composed of:

a metal element selected from the group consisting of elements belonging to the groups 2A, 3B, 4A and 5A; and an oxo or hydroxyoxygen-containing compound selected from the group consisting of β-diketone, ketoester, hydroxycarboxylic acid, ester of hydroxycarboxylic acid, aminoalcohol, enolic active hydrogen compound and acetyl acetone derivative.

(3) The lithographic printing plate precursor according to the item (2), wherein the metal element constituting the metal complex catalyst is a metal element selected from the group consisting of Zr, Ti and Al.

(4) The lithographic printing plate precursor according to the item (2), wherein the acetyl acetone derivative constituting the metal complex catalyst is acetylacetone having a substituent on at least one carbon atom of the methyl group, the methylene group or the carbonyl carbon.

(5) The lithographic printing plate precursor according to the item (1), wherein the metal complex catalyst is a mononuclear complex having from 1 to 4 acetylacetone derivative molecules per one metal element.

(6) The lithographic printing plate precursor according to the item (2), wherein the acetyl acetone derivative constituting the metal complex catalyst is acetylacetone or diacetylacetone.

(7) The lithographic printing plate precursor according to the item (1), wherein the metal complex catalyst is a tris (acetylacetonato) aluminum complex salt represented by the following general formula (1):

(1)

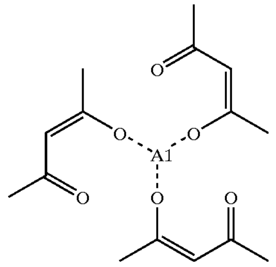

(8) The lithographic printing plate precursor according to the item (1), wherein the hydrophilic polymer is the silane coupling group-terminated hydrophilic polymer.

(9) The lithographic printing plate precursor according to the item (1), wherein the hydrophilic polymer is a polymer represented by the following general formula (1-1):

(1-1)

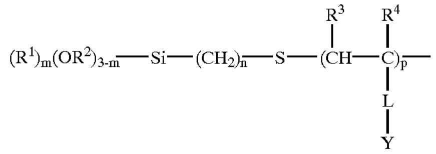

wherein $R^1$, $R^2$, $R^3$ and $R^4$ each independently represents a hydrogen atom or a hydrocarbon group having 8 or less carbon atoms, m represents an integer of 0 to 2, n represents an integer of from 1 to 8, and p represents an integer of from 30 to 300, Y represents $—NHCOCH_3$, $—CONH_2$, $—CON(CH_3)_2$, $—COCH_3$, —OH, $—CO_2M$ or $—CONHC(CH_3)_2SO_3M$, M represents a hydrogen atom, alkaline metal, alkaline earth metal or onium, L represents a single bond or an organic connecting group.

(10) The lithographic printing plate precursor according to the item (1), which further comprises a solid particle.

The invention has been worked out concerning a process for the preparation of a printing plate precursor having a heat-hydrophobicizable hydrophilic layer comprising a particulate hydrophobicizing precursor, a photo-heat converting agent and a hydrophilic polymer having a silane coupling group and is characterized in that the incorporation of a specific sol-gel conversion reaction accelerating catalyst in the hydrophilic layer causes the acceleration of curing of the hydrophilic layer. The use of this specific catalyst makes it possible to realize a lithographic printing plate precursor which is free from producibility problems with the use of conventional catalysts, i.e., inorganic acid or alkali, such as change of coating solution with time and defectives of conditions of coated surface and has improvements in printing properties such as press life and background stain resistance and print quality.

The aforementioned specific catalyst is a metal complex catalyst comprising a metal complex composed of a metal element selected from the group consisting of elements belonging to the groups 2A, 3B, 4A and 5A and an oxo or hydroxyoxygen-containing compound selected from the group consisting of β-diketone, ketoester, hydroxycarboxylic acid, ester thereof, aminoalcohol and enolic active hydrogen compound. Among these metal elements, Zr, Ti and Al exert a particularly excellent effect. Excellent among oxo or hydroxyoxygen-containing compounds are acetylacetone and diacetylacetone. Among these combinations, tris (acetylacetonato) aluminum complex salt has the greatest effect on the aim of the invention. These metal complexes, particularly tris(acetylacetonato) aluminum complex salt, presumably have a stable coordination structure in the coating solution and hence no aging problems and use a mechanism as in alkali catalyst to accelerate crosslinking in dehydration condensation during drying.

DETAILED DESCRIPTION OF THE INVENTION

Embodiments of implementation of the invention will be described in detail hereinafter.

[Metal Complex Catalyst]

The metal complex catalyst to be incorporated in the hydrophilic layer of the printing plate precursor of the invention will be described hereinafter.

The hydrophilic layer of the printing plate precursor of the invention comprises at least a sol-gel conversion type binder component. The sol-gel conversion system to be incorporated in the hydrophilic layer normally comprises as a catalyst an inorganic acid such as nitric acid and hydrochloric acid or a base such as ammonia to accelerate gelation but comprises a metal complex catalyst in the invention. The metal complex catalyst is preferably a metal complex composed of a metal element selected from the group consisting of elements belonging to the groups 2A, 3B, 4A and 5A and an oxo or hydroxyoxygen-containing compound selected from the group consisting of β-diketone, ketoester, hydroxycarboxylic acid, ester thereof, aminoalcohol and enolic active hydrogen compound.

Preferred among constituent metal elements are elements belonging to the group 2A such as Mg, Ca, St and Ba, elements belonging to the group 3B such as Al and Ga, elements belonging to the group 4A such as Ti and Zr and elements belonging to the group 5A such as V, Nb and Ta. These metal elements each form a complex having an excellent effect. Excellent among these complexes are those formed by Zr, Al and Ti.

Examples of the oxo or hydroxyoxygen-containing compound constituting the ligand of the aforementioned metal complex include β-diketones such as acetylacetone(2,4-pentanedione) and 2,4-heptanedione, ketoesters such as methyl acetoacetate, ethyl acetoacetate and butyl acetoacetate, hydroxycarboxylic acids such as lactic acid, methyl lactate, salicylic acid, malic acid and tartaric acid, ester thereof such as ethyl salicylate, phenyl salicylate and methyl tartrate, ketoalcohols such as 4-hydroxy-4-methyl-2-pentanone, 4-hydroxy-2-pentanone, 4-hydroxy-4-methyl-2-pentanone and 4-hydroxy-2-heptanone, aminoalcohols such as menoethanolamine, N,N-dimethylethanolamine, N-methyl-monoethanolamine, diethanolamine and triethanolamine, enolic active compounds such as methylolurea, methylolacrylamide and diethylester malonate, and compounds comprising acetylacetone (2,4-pentanediol) having substituents on methyl group, methylene group or carbonyl carbon.

The ligand is preferably an acetylacetone derivative. The term "acetylacetone derivative" as used herein is meant to indicate a compound comprising acetylacetone having substituents on methyl group, methylene group or carbonyl carbon. Examples of the substituents on the methyl group in acetylacetone include $C_1$–$C_3$straight-chain or branched alkyl group, acyl group, hydroxyalkyl group, carboxyalkyl group, alkoxy group, and alkoxyalkyl group. Examples of the substituents on the methylene group in acetylacetone include carboxyl group, and $C_1$–$C_3$ straight-chain or branched carboxyalkyl group and hydroxyalkyl group. Examples of the substituents on the carbonyl carbon in acetylacetone include $C_1$–$C_3$ alkyl group. In this case, a hydrogen atom is bonded to the carbonyl oxygen to form a hydroxyl group.

Specific preferred examples of the acetylacetone derivative include acetylacetone, ethylcarbonylacetone, n-propylcarbonylacetone, i-propylcarbonylacetone, diacetylacetone, 1-acetyl-1-propionyl-acetylacetone, hydroxyethylcarbonylacetone, hydroxypropylcarbonylacetone, acetoacetic acid, acetopropionic acid, diacetoacetic acid, 3,3-diacetopropionic acid, 4,4-diacetobutyric acid, carboxyethylcarbonylacetone, carboxypropylcarbonylacetone, and diacetone alcohol. Particularly preferred among these acetylacetone derivatives are acetylacetone and diacetylacetone.

The complex of the aforementioned acetylacetone derivative with the aforementioned metal element is a mononuclear complex having from 1 to 4 acetylacetone derivative molecules attached to one metal element. When the coordination number of the metal element is greater than the total coordination number of the acetylacetone derivatives, ligands commonly used in ordinary complexes such as water molecule, halogen ion, nitro group and ammonio group may be attached to the metal element.

Specific preferred examples of the metal complex include tris(acetylacetonato) aluminum complex, di(acetylacetonato) aluminum aqua-complex, mono (acetylacetonato) aluminum chloro-complex, di(diacetylacetonato) aluminum complex, (diacetylacetonato) aluminum aqua-complex, tris (acetylacetonato) barium complex, di(acetylacetonato) titanium complex, and tris(acetylactonato) titanium complex. These metal complexes exhibit an excellent stability in an aqueous coating solution and exert an excellent catalytic effect in sol-gel reaction during drying. Particularly preferred among these metal complexes is tris(acetylacetonato) aluminum complex ($Al(acaca)_3$) represented by the general formula (1).

The description of counter salt of the aforementioned metal complex is omitted herein. The kind of the counter salt to be used herein is arbitrary so far as it is a water-soluble salt which keeps the electric charge of the complex compound neutral. For example, salts which can be stoichiometrically kept neutral such as nitrate, halogenic acid salt, sulfate and phosphate may be used.

For the details of behavior of $Al(acaca)_3$ in silica sol-gel reaction, reference can be made to "J of Sol-Gel. Sci. and Tec. 16.209 (1999)". However, the application of the behavior of $Al(acaca)_3$ to the construction of the hydrophilic layer for lithographic printing as in the present system. As its reaction mechanism there may be presumed the following scheme. In other words, it is presumed that tris (acetylacetonato) aluminum complex has a coordination structure and thus is stable in a coating solution. It is also presumed that tris(acetylacetonato) aluminum complex uses a mechanism as in alkali catalyst to accelerate crosslinking in dehydration condensation reaction starting with drying step after coating. Anyway, the use of this organic metal complex made it possible to improve the age stability of coating solution, eliminate defectives of conditions of coated surface and attain desired press life and print quality such as background stain resistance at the same time.

[Substrate for Lithographic Printing Plate]

The materials constituting the heat-hydrophobicizable hydrophilic layer comprising a hydrophobicizing precursor, a photo-heat converting agent and a hydrophilic polymer having a silane coupling group provided on a support in the lithographic printing plate precursor prepared according to the invention will be described hereinafter. Since the imagewise polarity change in the hydrophilic layer causes the formation of an image, the hydrophilic layer is occasionally referred to as "image-recording layer" herein if the description is made focusing on the formation of an image.

(Hydrophilic Polymer Terminated by Silane Coupling Group)

Firstly, the hydrophilic polymer terminated by a silane coupling group will be described.

An example of the hydrophilic polymer having a silane coupling group at the end of main chain is a polymer represented by the following general formula (1-1):

(1-1)

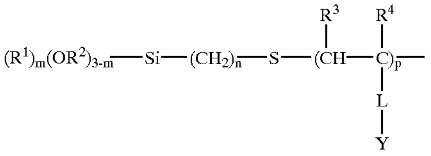

In the general formula (1-1), $R^1$, $R^2$, $R^3$and $R^4$ each represent a hydrogen atom or a hydrocarbon group having 8 or less carbon atoms, m represents an integer of 0 to 2, n represents an integer of from 1 to 8, and p represents an integer of from 30 to 300. Y represents —$NHCOCH_3$, —$CONH_2$, —$CON(CH_3)_2$, —$COCH_3$, —OH, —$CO_2M$ or —$CONHC(CH_3)_2SO_3M$ in which M represents any atom or element selected from the group consisting of hydrogen atom, alkaline metal, alkaline earth metal and onium.

L represents a single bond or organic connecting group. The term "organic connecting group" as used herein is meant to indicate a multivalent connecting group formed by a nonmetallic atom, specifically a group formed by from 1 to 60 carbon atoms, from 0 to 10 nitrogen atoms, from 0 to 50 oxygen atoms, from 1 to 100 hydrogen atoms and from 0 to 20 sulfur atoms. More specifically, a group formed by the following structural units, singly or in combination, may be used as the connecting group.

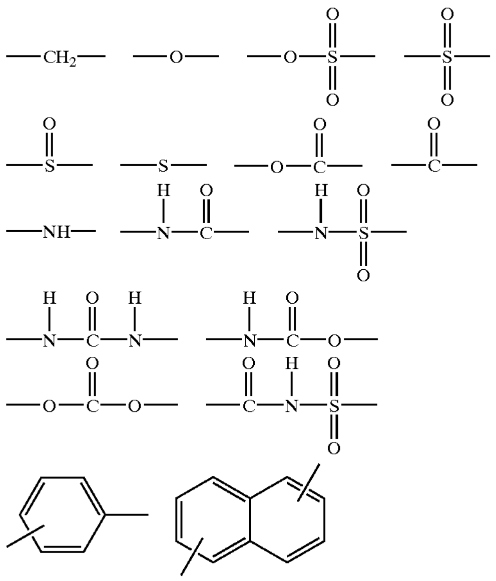

-continued

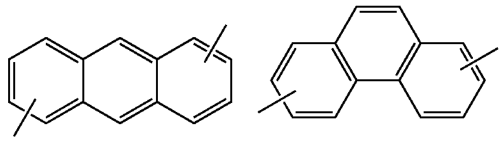

Specific examples of the hydrophilic polymer having a silane coupling group represented by the general formula (1) include the following polymers. In the following specific examples, p may be from 100 to 250.

1

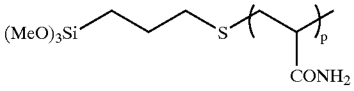

2

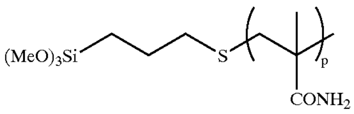

3

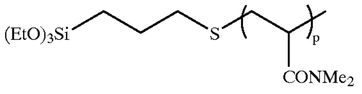

4

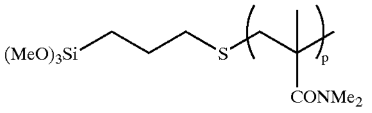

5

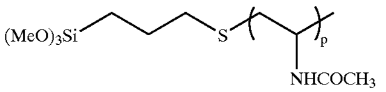

6

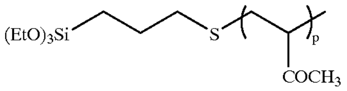

7

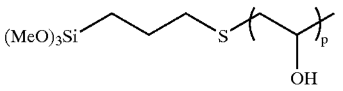

8

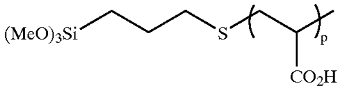

9

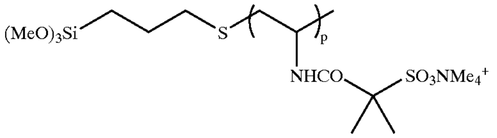

10

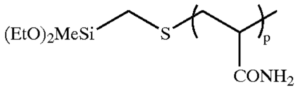

11

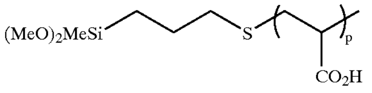

The aforementioned hydrophilic polymer according to the invention can be synthesized by subjecting a radical-polymerizable monomer represented by the following general formula (2) to radical polymerization in the presence of a silane coupling agent represented by the following general formula (3) having a chain transfer capacity in radical polymerization. Since the silane coupling agent (general formula (3)) has a chain transfer capacity, a polymer having a silane coupling group incorporated therein at the end of main chain can be synthesized by radical polymerization.

(2)

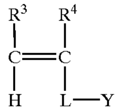

(3)

$$(R^1)_m(OR^2)_{3-m}\text{—Si—}(CH_2)_n\text{—S—H}$$

<Solid Particles>

The hydrophilic layer on the printing plate precursor according to the invention further comprises solid particles incorporated therein. The aforementioned hydrophilic polymer having a silane coupling group is preferably present chemically bonded to the surface of the solid particles. It is also preferred that the solid particles have hydrophilic polymers other than mentioned above bonded to the surface thereof. The chemical bonding of a hydrophilic polymer to the surface of solid particles is also referred to as "surface modification" herein.

As the solid particles to which the hydrophilic polymer is bonded there is preferably used a particulate metal oxide. Examples of the particulate metal oxide employable herein include metal oxides such as zinc oxide, titanium dioxide, iron oxide and zirconia, silicon-containing oxides which themselves have no absorption in the visible light range (also referred to as "white carbon") such as silicic anhydride, hydrous calcium silicate and hydrous aluminum silicate, and particulate clay minerals such as clay, talc, kaolin and zeolite.

The average particle diameter of the inorganic particulate material is preferably not greater than 10 $\mu$m, more preferably from 5 nm to 5 $\mu$m, even more preferably from 10 nm to 5 $\mu$m. When the average particle diameter of the inorganic particulate material falls within this range, the step of producing the photo-crosslinkable particles described later can be effected in a stable manner. Further, these particles can be kept fairly bonded to the support. Moreover, particles in the vicinity of the surface of the support can be fairly retained.

From the standpoint of hydrophilicity, film strength and ease of surface modification by hydrophilic polymer, the silicon-containing oxides are particularly preferred among the aforementioned inorganic particulate materials. Specific examples of these silicon-containing oxides include Snowtex ZL V (particle diameter: 70–100 nm; 40% colloidal aqueous solution) (produced by NISSAN CHEMICAL INDUSTRIES, LTD.), Silysia 350 (particle diameter: 3.5 $\mu$m) (produced by Fuji Silysia Chemical Ltd.), AEROSIL130 (particle diameter: 160 nm) (produced by Nippon Aerosil Co., Ltd.), AEROSIL 200 (silica having a particle diameter of 15 nm) (produced by Nippon Aerosil Co., Ltd.), and MIZUKASIL (silica having a particle diameter of 60 nm) (produced by MIZUSAWA INDUSTRIAL CHEMICALS, LTD.).

When the particle diameter of the surface-hydrophilic sol particles to be used herein (occasionally referred generically to simply as "particulate silica"), regardless of whether or not they are surface-modified, falls within the above defined range, the strength of the image-recording layer can be sufficiently retained. Thus, when the printing plate precursor is exposed to laser beam or the like, a printing plate can be prepared which has so extremely excellent a hydrophilicity that the non-image area cannot be stained by the printing ink when used for printing. The amount of the hydrophilic sol particles, if incorporated in the image-recording layer, is from 5 to 80% by mass, preferably from 20 to 60% by mass based on the solid content of the image-recording layer.

<Surface Modification by Hydrophilic Polymer>

The surface modification by the hydrophilic polymer can be carried out by proper application of known methods. For example, a hydrophilic polymer having a silane coupling group at the end of main chain can be easily incorporated in the particulate silica on the surface thereof by sol-gel reaction.

The hydrophilic polymer to be used herein is not specifically limited. In practice, however, it is particularly preferred that the hydrophilic polymer having a silane coupling group represented by the general formula (1) be included. Examples of the hydrophilic functional group to be incorporated in the hydrophilic polymer include the substituents Y and L in the general formula (1), carboxylic acid group, sulfonic acid group, sulfinic acid group, phosphonic acid group, amino group, salt thereof, amide group, hydroxyl group, ether group, and polyoxyethylene group.

As the method for the surface modification by the hydrophilic polymer having a silane coupling group there may be used a method which comprises treating the surface of silica with a silane coupling agent capable of initiating polymerization, and then subjecting the material to graft polymerization reaction with a hydrophilic monomer besides the method which comprises bonding a polymer represented by the general formula (1) directly to the solid particles. In accordance with this method, surface-modified particles modified with a hydrophilic polymer can be obtained.

Examples of the hydrophilic monomer employable herein include carboxyl groups, sulfonic acid groups, amino groups and salts thereof such as (meth)acrylic acid, alkaline metal and amine salts thereof, 2-hydroxyethyl (meth)acrylate, (meth)acrylamide, N-monomethylol (meth)acrylamide, N-dimethylol (meth)acrylamide, allylamine, halogenated hydrochlorinate thereof, 3-vinylpropionic acid, alkaline metal and amine salts thereof, vinylsulfonic acid, alkaline metal and amine salts thereof, 2-sulfoethylene (meth) acrylate, 3-sulfopropylene (meth)acrylate, alkaline metal and amine salts thereof, polyoxyethylene glycol mono (meth)acrylate, 2-acrylamide-2-methylpropanesulfonic acid, alkalinemetal and amine salts thereof, acid phosphoxy-polyoxyethylene glycol mono (meth)acrulate, allylamine, halogenated hydrochlorate thereof, 2-trimethylaminoethyl (meth)acrylate, and halogenated hydrochlorate thereof.

For the details of the aforementioned surface modification method, reference can be made to Noboru Suzuki, Nobuko Yuzawa, Atsushi Endo, Hiroshi Uzuki, "Shikizai (Coloring Material)", vol. 57, page 429, 1984, Hiroshi Yoshioka, Masayuki Ikeno, "Hyoumen (Surface)", vol. 21, page 33, 1983, Hiroshi Uzuki, "Hyoumen (Surface)", vol. 16, page 525, 1978, K. Tanaka, et al., "Bull. Chem. Soc. Jpn.", vol. 53, page 1242, 1980, M. L. Hair, W. Hertl., "J. Phys. Chem.", vol. 77, page 165, 1973, Ya, Davydov et al., "Chromatographia", vol. 14, page 13, 1981, K. Inger et al., "Colloid Polym. Sci.", vol. 252, page 317, 1974, R. Burwell, O. Leal, J. Chem. Soc. Chem. Commun.", page 342, 1974, W. Stoeber, "Kolloid-Z", page 149, page 39, 1956, K. Yoshinaga, et al., "Polym. Adv. Technol", vol. 3, page 91, 1992, N. Tsubokawa, et al., "Polym. J.", vol. 21, page 475, 1989, Franz. Pat. 1368765, DAS 1163784, etc. The methods described in these general remarks, references and patents can be employed to synthesize the desired surface-modified polymer.

<Crosslinking of Surface-modified Particles>

An example of the crosslinking agent to be used to strengthen the surface-modified layer or enhance the adhesion of the surface-modified particles is a hydrolytically-polymerizable compound represented by the following general formula (II). During this hydrolytic polymerization, the aforementioned metal complex which is an acetylacetone derivative is used as a catalyst to accelerate the hydrolytic polymerization, thereby effectively curing the gel layer. The added amount of the metal complex is such that at least the catalytic action for hydrolytic polymerization reaction can appear but is preferably from $10^{-4}$ to $10^{-1}$ mol/mol, more preferably from $10^{-3}$ to $10^{-1}$ mol/mol per siloxane unit.

$$(R^5)_m—X—(OR^6)_{4-m} \qquad (II)$$

In the general formula (II), $R^5$ and $R^6$ may be the same or different and each represent an alkyl or aryl group, X represents Si, Al, Ti or Zr, and m represents an integer of from 0 to 2. The number of carbon atoms in the alkyl group represented by $R^5$ or $R^6$ is preferably from 1 to 4. The alkyl or aryl group represented by $R^5$ or $R^6$ may have substituents. The hydrolytically-polymerizable compound represented by the general formula (II) is a low molecular compound, preferably having a molecular weight of not greater than 1,000.

Examples of the hydrolytically-polymerizable compound comprising aluminum incorporated therein include trimethoxy aluminate, triethoxy aluminate, tripropoxy aluminate, and tetraethoxy aluminate. Examples of the hydrolytically-polymerizable compound comprising titanium incorporated therein include trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate. Examples of the hydrolytically-polymerizable compound comprising zirconium incorporated therein include those obtained by replacing titanate in the aforementioned compounds by zirconate.

Examples of the hydrolytically-polymerizable compound comprising silicon incorporated therein include trimethoxy silane, triethoxy silane, tripropoxy silane, tetramethoxy silane, tetraethoxy silane, tetrapropoxy silane, methyltrimethoxy silane, ethyltriethoxy silane, propyltrimethoxy silane, methyltriethoxy silane, ethyltriethoxy silane, propyltriethoxy silane, dimethyldimethoxy silane, diethyldiethoxy silane, γ-chloropropyltriethoxy silane, γ-mercaptopropyltrimethoxy silane, γ-mercaptopropyltriethoxy silane, γ-aminopropyltriethoxy silane, phenyltrimethoxy silane, phenyltriethoxy silane, phenyltripropoxy silane, diphenyldimethoxy silane, and diphenyldiethoxy silane.

Particularly preferred among these compounds are tetramethoxy silane, tetraethoxy silane, methyltrimethoxy silane, ethyltrimethoxy silane, methyltriethoxy silane, ethyltriethoxy silane, dimethyldiethoxy silane, phenyltrimethoxy silane, phenyltriethoxy silane, diphenyldimethoxy silane, and diphenyldiethoxy silane.

The surface-modifying particles and the compounds of the general formula (II) each may be used singly or in combination of two or more thereof. The compound of the general formula (II) may be partly hydrolyzed before dehydration. In order to enhance the storage stability of the image-forming material in the form of solution before being applied to the substrate, it is effective to protect the active metal hydroxyl group in the inorganic polymer obtained by the partial hydrolytic polymerization of the hydrolytically-polymerizable organic metal compound represented by the general formula (II), e.g., silanol group (Si—OH). The protection of the silanol group can be accomplished by etherifying (Si—OR) the silanol group by a higher alcohol such as t-butanol and i-propyl alcohol (R indicates a group which is arbitrary but not specific). In some detail, the protection of the silanol group can be accomplished by adding the aforementioned higher alcohol to an inorganic phase having silica particles dispersed therein. The storage stability of the image-forming material can be further enhanced by dehydrating the inorganic phase, e.g., by heating the inorganic phase, and then distilling off the separated water, depending on the properties of the inorganic phase.

In the invention, the composite of surface-modifying particles with crosslinking agent obtained by crosslinking surface-modifying particles with a crosslinking agent represented by the general formula (II) is incorporated in the hydrophilic layer in an amount of from 2 to 90% by mass, preferably from 5 to 80% by mass, particularly from 10 to 50% by mass based on the total solid content of the hydrophilic layer in the lithographic printing plate precursor. When the content of particles falls below 2% by mass, the resulting printing plate precursor exhibits an insufficient water retention that can cause background stain. On the contrary, when the content of particles exceeds 50% by mass, the resulting printing plate precursor has a hydrophilic layer having a lowered strength that causes deterioration of press life and exhibits a deteriorated adhesion between the support and the hydrophilic layer.

<Method for Forming Composite of Surface-modifying Particles with Crosslinking Agent>

The organic-inorganic composite comprising surface-modifying particles and crosslinking agent of the invention can be prepared by hydrolytic polymerization. As the hydrolytic polymerization method there may be any known method as disclosed in "Zoru-Geru Ho no kagaku (Science of Sol-Gel method)", Agne Shofusha. Referring to a preferred example, to a solution of the surface-modifying particles and crosslinkingagent (e.g., compound of the general formula (II)) of the invention in an alcohol, preferably methanol or ethanol, is an acid (phosphoric acid, hydrochloric acid, sulfuric acid, acetic acid), particularly phosphoric acid, or an alkali (aqueous ammonia) as a catalyst to prepare a starting material solution. Subsequently, the starting material solution is stirred at a temperature of from 0° C. to 100° C., preferably from 10° C. to 80° C., under reflux for 5 minutes to 6 hours, particularly for 10 minutes to 2 hours so that it undergoes hydrolytic polymerization to produce an inorganic-organic composite comprising surface-modifying particles and crosslinking agent.

(Photo-heat Converting Agent)

The photo-heat converting agent to be incorporated in the hydrophilic layer in the printing plate precursor according to the invention indicates a material having an absorbance of at least $0.3\times10^3$ $cm^{-1}$, preferably not smaller than $1\times10^3$ $cm^{-1}$, more preferably not smaller than $1\times10^4$ $cm^{-1}$, which doesn't substantially convert absorbed light to fluorescent light or phosphorescence. The absorbance is obtained by dividing the transmission density by the thickness. In the case where a material is substantially molecularly dispersed in a medium as in dye, the absorption factor of the medium is defined as absorbance. It goes without saying that, strictly speaking, most materials have a photo-heat converting effect, even though very little, because they absorb light more or less and, once excited by absorbed light, they release heat unless they emit fluorescence or photosphorescence as their energy level returns to ground state. Accordingly, the term "photo-heat converting material" as used herein is meant to indicate a material having light absorption characteristics great enough to cause desired thermal change. The photo-heat converting agent of the invention indicates a material having at least the aforementioned absorbance from the standpoint of the aim of the invention. The photo-heat converting agent of the invention satisfying the aforementioned requirements may be any of metal, metal compound such as metal oxide, metal nitride, metal sulfide and metal carbide, non-metallic element, non-metallic compound, carbon element, pigment and dye.

<Particulate Photo-heat Converting Metal Compound>

The particulate photo-heat converting metal compound may be any of particulate metal compound made of a material which itself is hydrophobic, particulate metal compound made of a material which itself is hydrophilic and particulate metal compound made of a material which itself is intermediate between hydrophobic and hydrophilic.

This kind of a metal compound is preferably a transition metal oxide, a sulfide of metal element belonging to the groups II to VIII or nitride of metal element belonging to the groups III to VIII. Examples of the transition metal oxide include oxides of iron, cobalt, chromium, manganese, nickel, molybdenum, tellurium, niobium, yttrium, zirconium, bismuth, ruthenium and vanadium. The classification doesn't necessary include transition metals. Oxides of zinc, mercury, cadmium, silver and copper may be used herein. Particularly preferred among these metal oxides are FeO, $Fe_2O_3$, CoO, $Cr_2O_3$, $MnO_2$, $ZrO_2$, $Bi_2O_3$, CuO, $CuO_2$, AgO, PbO, $PbO_2$, and VOx (in which x is from 1 to 5). Examples of VOx include VO, $V_2O_3$ and $VO_2$, which are black, and $V_2O_5$, which is brown.

Further preferred examples of inorganic metal oxide include TiOx (in which x is from 1.0 to 2.0), SiOx (in which x is from 0.6 to 2.0), and AlOx (in which x is from 1.0 to 2.0). Examples of TiOx (in which x is from 1.0 to 2.0) include TiO, which is black, $Ti_2O_3$, which is dark purple, and $TiO_2$, which assumes various colors depending on crystal form and impurities. Examples of SiOx (in which x is from 0.6 to 2.0) include SiO, $Si_3O_2$, and $SiO_2$, which assumes colorless or assumes purple, blue or red depending on materials present therewith. Examples of AlOx (in which x is 1.5) include corundum, which assumes colorless or assumes red, blue or green depending on materials present therewith.

The metal oxide, if it is a lower oxide of a polyvalent metal, may be a photo-heat converting agent which is also a self-heating air oxidation reactive material. This kind of a metal oxide is desirable because heat energy generated as a result of exothermic reaction can be utilized besides energy of light absorbed. Examples of these lower oxides of polyvalent metal include lower oxides of Fe, Co and Ni. Specific examples of these oxides include ferrous oxide, triiron tetraoxide, titanium monoxide, stannous oxide, and chromous oxide. Preferred among these oxides are ferrous oxide, triiron tetraoxide, and titanium monoxide.

Whether or not the exothermic reaction occurs can be easily confirmed by a differential thermobalance (TG/DTA). As the temperature of an exothermic reaction material inserted in a differential thermobalance is raised at a predetermined rate, an exotherm peak appears at a certain temperature to allow observation of exothermic reaction. In the case where the oxidation reaction of a metal or lower oxide of metal is used as exothermic reaction, an exotherm peak appears and a rise in the weight is similarly observed in the thermobalance. To repeat, the utilization of exothermic reaction energy in addition to photo-heat converting mechanism makes it possible to utilize more thermal energy per unit dose than ever continuously and hence enhance the sensitivity.

In the case where the particulate photo-heat converting material is made of a metal sulfide, the metal sulfide is preferably a sulfide of a heavy metal such as transition metal. Particularly preferred examples of sulfide include sulfides of iron, cobalt, chromium, manganese, nickel, molybdenum, tellurium, strontium, tin, copper, silver, lead and cadmium. Preferred among these sulfides are silver sulfide, ferrous sulfide, and cobalt sulfide.

In the case where the particulate photo-heat converting material is made of a metal nitride, the metal nitride is preferably an azide compound of a metal. Particularly preferred examples of azide compound include azide compounds of copper, silver and tin. These azide compounds are also exothermic compounds which generate heat upon photodecomposition. Other preferred examples of the inorganic metal nitride include TiNx (in which x is from 1.0 to 2.0), SiNx (in which x is from 1.0 to 2.0), and AlNx (in which x is from 1.0 to 2.0). Examples of TiNx (in which x is from 1.0 to 2.0) include TiN, which is bronzy, and TiNx (in which x is 1.3). Examples of SiNx (in which x is from 1.0 to 2.0) include $Si_2N_3$, SiN, and $Si_3N_4$. Examples of AlNx (in which x is from 1.0 to 2.0) include AlN.

The aforementioned various metal oxides, sulfides and nitrides can be obtained by any known production methods. These metal oxides, sulfides and nitrides include many products commercially available by the name of titanium black, iron black, molybdenum red, Emerald Green, cadmium red, cobalt blue, prussian blue, ultramarine, etc.

The optimum particle size of these hydrophilic metal compounds differs with the refractive index or absorption factor of the material constituting the particles but normally is from 0.005 $\mu$m to 5 $\mu$m, preferably from 0.01 $\mu$m to 3 $\mu$m. When the particle size of these hydrophilic metal compounds is too small, the resulting light scattering causes the reduction of efficiency in light absorption. On the contrary, when the particle size of these hydrophilic metal compounds is too great, the resulting grain boundary reflection causes the reduction of efficiency in light absorption.

<Particulate Photo-heat Converting Metal>

The particulate photo-heat converting metal will be further described hereinafter. Most metal particles are capable of converting light to heat as well as are exothermic and thus absorb light to generate heat and then undergoes exothermic reaction with the heat thus generated as a trigger to generate a larger amount of heat.

Examples of the particulate metal include particulate magnesium, aluminum, silicon, titanium, vanadium, chromium, manganese, iron, cobalt, nickel, copper, zinc, gallium, germanium, yttrium, niobium, molybdenum, technetium, rubidium, palladium, silver, cadmium, indium, tin, antimony, hafnium, tantalum, tungsten, rhenium, osmium, iridium, platinum, gold and lead. These particulate metals are capable of converting light to heat as well as are exothermic. Preferred among these particulate metals are those which can easily undergo exothermic reaction such as oxidation reaction due to thermal energy developed by the conversion of light absorbed to heat. Specific examples of these particulate metals include aluminum, silicon, titanium, vanadium, chromium, manganese, iron, cobalt, nickel, copper, zinc, yttrium, zirconium, molybdenum, silver, indium, tin, and tungsten. Particularly preferred among these particulate metals are iron, cobalt, nickel, chromium, titanium and zirconium, which exhibit a remarkably high absorbance of radiation and generate a remarkably high exothermic reaction energy.

These metals each may be composed of an alloy of two or more components rather than a single particle. The particulate metal may be composed of a metal and the aforementioned metal oxide, nitride, sulfide or carbide. A metal generates a greater thermal energy from exothermic reaction such as oxidation in the form of simple body than in the form of alloy or composite. However, some metals find trouble in handing in air and can spontaneously ignite in contact with air. Such a metal powder is preferably coated with an oxide, nitride, sulfide or carbide of metal to a thickness of several nanometers. The diameter of these particles is not greater than 10 μm, preferably from 0.005 μm to 5 μm, more preferably from 0.01 μm to 3 μm. When the diameter of these particles is not greater than 0.01 μm, the particles can be difficultly dispersed. On the contrary, when the diameter of these particles is not smaller than 10 μm, the resulting printed matter has a deteriorated resolution.

<Photo-heat Converting Non-metallic Simple Body>

In the invention, particulate photo-heat converting non-metallic simple bodies and compounds are used besides the aforementioned metal compounds and metals. As these particulate photo-heat converting materials there may be used various organic and inorganic pigments besides simple particles such as carbon black, graphite and bone black.

<Photo-heat Converting Pigment and Dye>

In the invention, any finely-dispersible pigments and dyes which have a photo-heat converting capacity with respect to light for recording image can be used. The pigment may be any of metal complex pigments and non-metallic pigments. The pigment may be present molecularly dispersed in composite particles (dye in a narrow sense). Thus, the term "pigment" as used hereinafter may include molecularly dispersed dyes. The term "dye" as used hereinafter is meant to indicate a wide sense including pigments and dyes in a narrow sense. Which the pigment or dye is in the state of solid particles or molecularly dispersed depends on the state of the medium. Further, the pigment or dye can exhibit a photo-heat converting capacity regardless of the state thereof. Therefore, the pigment and dye are described hereinafter altogether.

As the dye there may be used any of commercial available dyes and known dyes disclosed in references (e.g., "Senryo Binran (Handbook of Dyes)", The Society of Synthetic Organic Cehemistry, Japan, 1970). Specific examples of these dyes include azo dyes, metal complex azodyes, pyrazolone azo dyes, anthraquinone dyes, phthalocyanine dyes, carbonium dyes, quinonimine dyes, methine dyes, cyanine dyes, and metal thiolate complexes. Preferred examples of these dyes include cyanine dyes disclosed in Japanese Patent Laid-Open No. 1983-125246, Japanese Patent Laid-Open No. 1984-84356, Japanese Patent Laid-Open No. 1984-202829 and Japanese Patent Laid-Open No. 1985-78787, methine dyes disclosed in Japanese Patent Laid-Open No. 1983-173696, Japanese Patent Laid-Open No. 1983-181690 and Japanese Patent Laid-Open No. 1983-194595, naphthoquinone dyes disclosed in Japanese Patent Laid-Open No. 1983-112793, Japanese Patent Laid-Open No. 1983-224793, Japanese Patent Laid-Open No. 1984-48187, Japanese Patent Laid-Open No. 1984-73996, Japanese Patent Laid-Open No. 1985-52940 and Japanese Patent Laid-Open No. 1985-63744, squarilium dyes disclosed in Japanese Patent Laid-Open No. 1983-112792, and cyan dyes disclosed in British Patent 434,875.

Further, near infrared-absorbing sensitizers disclosed in U.S. Pat. No. 5,156,938 can be used to advantage. Moreover, substituted arylbenzo (thio)pyrilium salts disclosed in U.S. Pat. No. 3,881,924, trimethinethiapyrilium salts disclosed in Japanese Patent Laid-Open No. 1982-142645 (U.S. Pat. No. 4,327,169), pyrilium-based compounds disclosed in Japanese Patent Laid-Open No. 1983-181051, Japanese Patent Laid-Open No. 1983-220143, Japanese Patent Laid-Open No. 1984-41363, Japanese Patent Laid-Open No. 1984-84248, Japanese Patent Laid-Open No. 1984-84249, Japanese Patent Laid-Open No. 1984-146063 and Japanese Patent Laid-Open No. 1984-146061, cyan dyes disclosed in Japanese Patent Laid-Open No. 1984-216146, pentamethinethiopyrilium dyes disclosed in U.S. Pat. No. 4,283,475, and pyrilium compounds disclosed in Japanese Patent Publication No. 1993-13514 and Japanese Patent Publication No. 1993-19702. Other preferred examples of the dye employable herein include near infrared-absorbing dyes of the general formulae (I) and (II) disclosed in U.S. Pat. No. 4,756,993. Preferred among these dyes are those having a strong absorption range in the infrared range selected from the group consisting of polymethine dyes, cyanine dyes, squarilium dyes, pyrilium dyes, diimmonium dyes, phthalocyanine compounds, triarylmethane dyes and metal dithiorenes. Among these dyes, polymethine dyes, cyanine dyes, squarilium dyes, pyrilium dyes, diimmonium dyes and phthalocyanine compounds are more desirable. Most desirable among these dyes are polymethine dyes, cyanine dyes and phthalocyanine compounds from the standpoint of synthesizability.

As the pigment of the invention there may be used any of commercial available pigments and pigments disclosed in Handbook of Color Index (C.I.), "Saishin Ganryo Binran (Handbook of Modern Pigments)", Japan Association of Pigment Technology, 1977, "Saishin Ganryo Oyo Gijutsu (Modern Pigment Application Technology)", CMC, 1986, and "Insatsu Inki Gijutsu (Printing Ink Technology)", CMC, 1984. Examples of the pigment employable herein include black pigments, yellow pigments, orange pigments, brown pigments, red pigments, purple pigments, blue pigments, green pigments, fluorescent pigments, metal powder pigments, and polymer-bonded dyes. Specific examples of these pigments include insoluble azo pigments, azo lake pigments, condensed azo pigments, chelate azo pigments, phthalocyanine-based pigments, anthraqinone-based pigments, perylene-based pigments, perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, and carbon black. Preferred among these pigments is carbon black.

These pigments may or may not be subjected to surface treatment before use. Examples of the surface treatment method include a method which comprises coating the surface of the pigment with a resin or wax, a method which comprises attaching a surface active agent to the pigment, and a method which comprises bonding a reactive material (e.g., silane coupling agent, epoxy compound, polyisocyanate) to the surface of the pigment. For the details of the aforementioned surface treatment method, reference can be made to "Kinzoku Sekken no Seishitsu to Oyo (Properties and Application of Metal Soaps)", Saiwai Shobo, "Insatsu Inki Gijutsu (Printing Ink Technology)", CMC, 1984, and "Saishin Ganryo Oyo Gijutsu (Modern Pigment Application Technology)", CMC, 1986.

The particle diameter of the pigment is preferably from 0.01 μm to 10 μm, more preferably from 0.05 μm to 1 μm, particularly from 0.1 μm to 1 μm. When the particle diameter of the pigment falls below 0.01 μm, it is disadvantageous in the stability of the dispersed photosensitive composition in the coating solution. On the contrary, when the particle diameter of the pigment exceeds 10 μm, it is disadvantageous in the uniformity of the image-recording layer thus formed. As the method for dispersing the pigment there may be used any known dispersing technique for use in the production of in or toner. Examples of the dispersing machine employable herein include ultrasonic dispersing machine, sand mill, attritor, pearl mill, supermill, ball mill, impeller, disperser, KD mill, colloid mill, dynatron, three-roll mill, and pressure kneader. For the details of the dispersing technique, reference can be made to "Saishin Ganryo Oyo Gijutsu (Modern Pigment Application Technology)", CMC, 1986.

The following dyes, too, can be used in the invention. Examples of these dyes include cobalt green (C. I. 77335), emerald green (C. I. 77410), phthalocyanine blue (C. I. 74100), copper phthalocyanine (C. I. 74160), ultramarine (C. I. 77007), prussian blue (C. I. 77510), cobalt purple (C. I. 77360), paleogene red 310 (C. I. 71155), permanent red BL (C. I. 71137), perylene red (C. I. 71140), rhodamine lake B (C. I. 45170: 2), heliobordeaux BL (C. I. 14830), light fast red toner R (C. I. 12455), fast scarlet VD, lithol fast scarlet G (C. I. 12315), permanent brown FG (C. I. 12480), indanthrene brilliant orange RK (C. I. 59300), chrome orange (C. I. 77601), hansa yellow 10G (C. I. 11710), titanium yellow (C. I. 77738), zinc yellow (C. I. 77955), and chrome yellow (C. I. 77600). Besides these dyes, various pigments to be incorporated in electrostatic recording toner can be used to advantage.

These dyes may be incorporated in the image-recording layer in an amount of from 0.01 to 50% by mass, preferably from 0.1 to 10% by mass, particularly from 0.5 to 10% by mass if they are dyes, from 1.0 to 10% by mass if they are pigments or from 0.2 to 3% by mass if they are silver particles, based on the total solid content of the composition of the image-recording layer. When the content of the pigment or dye falls below 0.01% by mass, the resulting printing plate precursor exhibits a lowered sensitivity. On the contrary, when the content of the pigment or dye exceeds 50% by mass, the resulting printing plate precursor is subject to stain on the non-image area during printing.

The content of the aforementioned photo-heat converting agents such as metal powder, non-metallic simple body and dye (pigment) in the image-recording layer is from 1% to 95% by mass, preferably from 3% to 90% by mass, more preferably from 5% to 80% by mass based on the solid constituents of the composite particle. When the content of the photo-heat converting agents falls below 1% by mass, the exotherm is insufficient. On the contrary, when the content of the photo-heat converting agents exceeds 95% by mass, the resulting printing plate precursor exhibits a deteriorated film strength.

The aforementioned various photo-heat converting agents such as metal compound, metal powder, non-metallic simple body and pigment, if they are particulate, may be hydrophobic, hydrophilic or intermediate therebetween on the surface thereof. The photo-heat converting agents which are hydrophobic on the surface thereof may be present with a hydrophobicizing precursor in most cases. The photo-heat converting agents which are hydrophilic on the surface thereof or even hydrophobic on the surface thereof may be adjusted for surface hydrophilicity or hydrophobicity by any known method such as method for surface treatment with a surface active agent, method for the introduction of hydroxyl group involving irradiation with plasma in the presence of water vapor after deaeration and method involving silicate treatment with tetraethoxysilane if necessary for improvement of dispersibility.

(Hydrophobicizing Precursor)

The description of the photo-heat converting agent has been completed. The hydrophobicizing precursor will be further described hereinafter. In the invention, various known materials which change in physical properties due to heat can be used as hydrophobicizing precursors. Examples of these hydrophobicizing precursors will be given below, but the invention should not be limited thereto.

A preferred hydrophobicizing precursor is a fine dispersion of a single composition which itself can switch from hydrophilic to hydrophobic due to heat or light or a surface-hydrophilic fine dispersion of a composite composition of hydrophobic material with hydrophilic material. When acted upon by heat or light, this composite fine dispersion causes the hydrophobic material to hydrophobicize particles and its neighbors. Examples of the former hydrophobicizing precursor include a fine dispersion which exhibits hydrophobicity due to heat fusion. Examples of the latter hydrophobicizing precursor include particles, microcapsuled particles and crosslinked particles having a composite form which is a double structure comprising a surface portion and an inner portion such as core-shell structure. In any cases, the organic material constituting the composite particle exerts a hydrophobicizing effect when the particle is destroyed by irradiation with light. Various forms of hydrophobicizing precursors will be described hereinafter.

<Fine Dispersion of Single Composition>

A preferred hydrophobicizing precursor is a dispersion of a simple body or compound which is hydrophobic itself and undergoes elution, diffusion or dissolution when acted upon heat to change in its physical properties, hydrophobicizing the interior of a composite particle and its neighbors. The desired compound is included in hydrophobic organic low molecular compounds and organic high molecular compounds.

The hydrophobicizing precursor which is an organic low molecular compound is preferably a solid or liquid organic compound which exhibits a melting point of not higher than 300° C. and a boiling point of not lower than 100° C. at ordinary pressure or an organic high molecular compound which exhibits a water solubility or water absorption of not greater than 2 g per 100 g. It is also preferred that both the two organic compounds be used. The organic low molecular compound exhibits a relatively high diffusibility and, when rendered mobile due to heat, diffuses in the vicinity of particles to hydrophobicize the particles directly or indirectly. Further, a compound which normally stays solid but melts due to heat to form a hydrophobic region can be used. When the mobility of the organic low molecular compound is too great, the resulting hydrophobic region is too wide. Further, the local concentration of thermal energy is reduced, lessening the hydrophobicizing effect. Accordingly, a compound satisfying both the requirements for boiling point and melting point is desirable. The term "low molecular compound" as used herein is meant to indicate a compound having a boiling point or melting point. Such a compound normally has a molecular weight of not greater than 2,000, mostly not greater than 1,000. The aforementioned conditions of solubility or water absorption are conditions which have empirically been found as indices of hydrophobicity of organic high molecular compound. Under these conditions, when acted upon by heat, the organic compound around the particles changes in its state to hydrophobicize the neighbors of the particles.

It has been empirically found necessary that an organic low molecular compound suitable for hydrophobicizing purpose have an extremely small water solubility or be highly organic from the standpoint of the necessity that it be sufficiently hydrophobic to hydrophilicize the neighbors of particles themselves besides the standpoint of melting point and boiling point associated with the mobility of the aforementioned compound. Referring in detail to these conditions, as described in Clause 5 of the aforementioned solution to the problems, the organic low molecular compound preferably has a solubility of not greater than 2 g in 100 g of water at 25° C. Alternatively, the organic low molecular compound preferably has an organicity/inorganicity ratio of not smaller than 0.7 in an organic-inorganic conceptional diagram.

The organic-inorganic conceptional diagram is an actual simple practical measure indicating the degree of organicity and inorganicity of a compound. For the details of the organic-inorganic conceptional diagram, reference can be made to Yoshio Tanaka, "Yuki Gainenzu (Organic-Inorganic Conceptional Diagram)", Sankyo Shuppan, 1983, pp. 1–31. The reason why an organic compound falling within the above defined range in the organic-inorganic conceptional diagram has an effect of accelerating hydrophobicization is unknown. This range of a compound is a compound having a relatively high organicity that hydrophobicizes the neighbors of particles. The organicity of such a compound in the organic-inorganic conceptional diagram is not smaller than 100. The upper limit of the organicity of such a compound is not specifically limited but normally is from 100 to 1,200, preferably from 100 to 800. Such a compound is an organic compound having an organicity/inorganicity ratio of from 0.7 to infinite (i.e., inorganicity of zero), preferably 0.9 to 10.

Specific examples of the organic low molecular compound having a boiling point falling within the above defined range include aliphatic hydrocarbons, aromatic hydrocarbons, aliphatic carboxylic acids, aromatic carboxylic acids, aliphatic alcohols, aromatic alcohols, aliphatic esters, aliphatic esters, aliphatic ethers, aromatic ethers, organic amines, organic silicon compounds, and various solvents or plasticizers which are known to be able to be incorporated in a printing ink, though having not too great an effect.

A preferred aliphatic hydrocarbon is an aliphatic hydrocarbon having from 8 to 30 carbon atoms, more preferably from 8 to 20 carbon atoms. A preferred aromatic hydrocarbon is an aromatic hydrocarbon having from 6 to 40 carbon atoms, more preferably from 6 to 20 carbon atoms. A preferred aliphatic alcohol is an aliphatic alcohol having from 2 to 30 carbon atoms, more preferably from 2 to 18 carbon atoms. A preferred aromatic alcohol is an aromatic alcohol having from 6 to 30 carbon atoms, more preferably from 6 to 18 carbon atoms. A preferred aliphatic carboxylic acid is an aliphatic carboxylic acid having from 2 to 24 carbon atoms, more preferably an aliphatic monocarboxylic acid having from 2 to 20 carbon atoms or an aliphatic polycarboxylic acid having from 4 to 12 carbon atoms. A preferred aromatic carboxylic acid is an aromatic carboxylic acid having from 6 to 30 carbon atoms, more preferably from 6 to 18 carbon atoms. A preferred aliphatic ester is an aliphatic acid ester having from 2 to 30 carbon atoms, more preferably from 2 to 18 carbon atoms. A preferred aromatic ester is an aromatic carboxylic acid ester having from 8 to 30 carbon atoms, more preferably from 8 to 18 carbon atoms. A preferred aliphatic ether is an aliphatic ether having from 8 to 36 carbon atoms, more preferably from 8 to 18 carbon atoms. A preferred aromatic ether is an aromatic ether having from 7 to 30 carbon atoms, more preferably from 7 to 18 carbon atoms. Besides these organic low molecular compounds, an aliphatic or aromatic amide having from 7 to 30 carbon atoms, more preferably from 7 to 18 carbon atoms can be used.

Specific examples of these organic low molecular compounds include aliphatic hydrocarbons such as 2,2,4-trimethylpentane(isooctane), n-nonane, n-decane, n-hexadecane, octadecane, eicosane, methyl heptane, 2,2-diemtylhexane and 2-methyloctane, aromatic hydrocarbons such as benzene, toluene, xylene, cumene, naphthalene, anthracene and styrene, monovalent alcohols such as dodecyl alcohol, octyl alcohol, n-octadecyl alcohol, 2-octanol and lauryl alcohol, polyvalent alcohols such as propylene glycol, triethylene glycol, tetraethylene glycol, glycerin, hexylene glycol and dipropylene glycol, aromatic alcohols such as benzyl alcohol, 4-hydroxytoluene, phenethyl alcohol, 1-naphthol, 2-naphthol, catechol and phenol, aliphatic monovalent carboxylic acids such as acetic acid, propionic acid, butyric acid, caproicacid, acrylicacid, crotonicacid, caprylic acid, stearic acid and oleic acid, polyvalent aliphatic carboxylic acids such as oxalic acid, adipic acid, maleic acid and glutaric acid, aromatic carboxylic acids such as benzoic acid, 2-methylbenzoic acid and 4-methylbenzoic acid, aliphatic esters such as ethyl acetate, isobutyl acetate, n-butyl acetate, methyl propionate, ethyl propionate, methyl butyrate, methyl acrylate, dimethyl oxalate, dimethyl succinate and methyl crotonate, aromatic carboxylic acid esters such as methyl benzoate and methyl 2-methylbenzoate, organic amines such as imidazole, triethanolamine, diethanolamine, cyclohexylamine, hexamethylenetetramine, triethylenetetramine, aniline, octylamine and phenethylamine, ketones such as acetone, methyl ethyl ketone, methyl isobutyl ketone and benzophenone, ethers such as methoxybenzene, ethoxybenzene, methoxytoluene, laurylmethyl ether and stearylmethyl ether, and amides such as stearylamide, benzoylamide and acetamide.

Further examples of these organic low molecular compounds include oils and fats such as linseed oil, soybean oil, poppy oil and safflower oil, and plasticizers such as tributyl phosphate, tricresyl phosphate, dibutyl phthalate, butyl laurate, dioctyl phthalate and paraffin wax, which are ingredients of printing ink.

Besides these organic low molecular compounds, organic solvents having a boiling point falling within the aforementioned preferred range such as ethylene glycol monoethyl ether, cyclohexanone, butyl cellosolve and cellosolve acetate may be used. Further, organic solvents described later with reference to microcapsule which may be incorporated in the core (interior of capsule wall) maybe used.

Preferred examples of organic silicon compounds include organosiloxane compounds such as dimethyl silicone oil and methylphenyl silicone oil, particularly organopolysiloxanes having a polymerization degree of not greater than 12. These preferred organopolysiloxanes each have 1 or 2 organic groups bonded thereto per siloxane bond unit. Examples of the organic group include $C_1$–$C_{18}$ alkyl and alkoxy groups, $C_2$–$C_{18}$ alkenyl and alkynyl groups, $C_6$–$C_{18}$aryl group, $C_7$–$C_{18}$aralkyl group, and $C_5$–$C_{20}$ alicyclic group. These organic substituents may be further substituted by halogen atom, carboxyl group or hydroxyl group. The aforementioned aryl group, aralkyl group and alicyclic group may be further substituted by a lower alkyl group such as methyl group, ethyl group and propyl group so far as the total carbon atoms fall within the above defined range.

Preferred examples of the organic silicon compound which can be used in the invention is a dimethyl polysiloxane having a polymerization degree of from 2 to 10, dimethyl siloxane-methylphenyl siloxane copolymer having a polymerization degree of from 2 to 10, dimethyl siloxane-diphenyl siloxane copolymer having a polymerization degree of from 2 to 8 or dimethyl siloxane-monomethyl siloxane copolymer having a polymerization degree of from 2 to 8. These polysiloxane compounds each are terminated by trimethylsilane group. Other preferred examples of the organic silicon compound include 1,3-bis(3-aminopropyl) tetramethyl disiloxane, 1,5-bis(3-aminopropyl)hexamethyl trisiloxane, 1,3-dibutyl-1,1,3,3-tetramethyldisiloxane, 1,5-dibutyl-1,1,3,3-tetramethyldisiloxane, 1,5-dibutyl-1,1,3,3,5,5-hexaethyl trisiloxane, 1,1,3,3,5,5-hexaethyl-1,5-dichlorotrisiloxane, 3-(3,3,3-trifluoropropyl)-1,1,3,3,5,5,5-heptamethyl-trisil oxane, and decamethyl tetrasiloxane.

A particularly preferred siloxane compound is a commercial available so-called silicone oil such as dimethyl silicone oil (commercial available as "Silicone KF96" (produced by Shin-Etsu Chemical Co., Ltd.) for example), methyl phenyl silicone oil (commercial available as "Silicone KF50" (produced by Shin-Etsu Chemical Co., Ltd.) for example) and methyl hydrogen silicone oil (commercial available as "Silicone KF99" (produced by Shin-Etsu Chemical Co., Ltd.) for example).

An ester of long-chain aliphatic acid with long-chain monovalent alcohol, i.e., wax, too, is a preferred low molecular organic compound which is hydrophobic and properly low-melting and melts due to heat generated upon irradiation with light in the vicinity of particulate photo-heat converting material to hydrophobicize the region. As a wax there is preferably used one which melts at a temperature of from 50° C. to 200° C. Examples of the wax employable herein include carnauba wax, castor wax, microcrystalline wax, paraffin wax, shellac wax, palm wax, and beeswax. Besides these waxes, low molecular polyethylenes, solid acids such as oleic acid, stearic acid and plamitic acid, metal salts of long-chain aliphatic acids such as silver behenate, calcium stearate and magnesium palmitate, etc. may be used in the form of fine dispersion.

The amount of these organic low molecular compounds which can be encapsulated in composite particles, if used, is preferably from 10% to 300% by mass, more preferably from 20% to 200% by mass, particularly from 30% to 150% by mass based on the particulate photo-heat converting materials.

Organic High Molecular Compound

Preferred examples of the aforementioned organic high molecular compound which can satisfy the requirements for solubility or water absorption to form hydrophobicizing precursor particles include condensed resins of polyvinyl chloride, polyvinyl alcohol, polyvinyl acetate, polyvinyl phenol, polyvinyl halogenated phenol, polyvinyl formal, polyvinyl acetal, polyvinyl butyral, polyamide, polyurethane, polyurea, polyimide, polycarbonae, epoxy resin, phenol novolak and resol phenol with aldehyde or ketone, acrylic copolymers having alkali-soluble group such as polyvinylidene chloride, polystyrene, silicone resin, active methylene, phenolic hydroxyl group, sulfonamide group and carboxyl group, binary, ternay and higher copolymer thereof, casein, and cellulose derivatives.

One of preferred compounds is phenol novolak resin or resol resin. Examples of these resins include novolak resin and resol resin obtained by condensation of phenol, cresol (m-cresol, p-cresol, m/p mixed cresol), phenol/cresol (m-cresol, p-cresol, m/p mixed cresol), phenol-modified xylene, tert-butylphenol, octylphenol, resorcinol, pyrogallol, catechol, chlorophenol (m-Cl, p-Cl), bromophenol (m-Br, p-Br), salicylic acid and phloroglucinol with formaldehyde, and condensed resins of the aforementioned phenolic compounds with acetone.

Other preferred high molecular compounds include copolymers normally having a molecular weight of from 10,000 to 200,000 comprising the following monomers (A) to (H) as structural units.

(A) Acrylamides and methacrylamides such as N-(4-hydroxyphenyl)acrylamide, N-(4-hydroxyphenyl) methacrylamide, N-ethyl acrylamide, N-ethyl methacrylamide, N-hexyl acrylamide, N-hexyl methacrylamide, N-cyclohexyl acrylamide, N-cyclohexyl methacrylamide, o-, m- and p-hydroxyphenyl acrylate and methacrylate;

(B) (Substituted) acrylic acid esters such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N-dimethylaminoethyl acrylate;

(C) (Substituted) methacrylic acid ester such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzylmethacrylate, 2-chloroethylmethacrylate, 4-hydroxybutyl methacrylate, glycidyl methacrylate and N-dimethylaminoethyl methacrylate;

(D) Vinyl ethers such as ethyl vinyl ether, 2-chloroethyl vinyl ether, hydroxy ethyl vinyl ether, propyl vinyl ether, butyl vinyl ether, octyl vinyl ether and phenyl vinyl ether;

(E) Vinyl esters such as vinyl acetate, vinyl chloroacetate, vinyl butyrate and vinyl benzoate;

(F) Styrenes such as styrene, methylstyrene and chloromethylstyrene;

(G) Vinyl ketones such as methyl vinyl ketone, ethyl vinyl ketone, propyl vinyl ketone and phenyl vinyl ketone; and (H) N-vinyl pyrrolidone, N-vinyl carbazole, 4-vinyl pyridine, acrylonitrile and methacrylonitrile.

These organic high molecular compounds each preferably have a weight-average molecular weight of from 500 to 20,000 and a number-average molecular weight of from 200 to 60,000 if they are obtained by synthesis. These organic high molecular compounds, if derived from natural polymers, may have been subjected to hydrolysis to have a reduced molecular weight. The amount of these organic high molecular compounds to be incorporated is preferably from 10% to 300% by mass, more preferably from 20% to 200% by mass, most preferably from 30% to 100% by mass based on the particulate photo-heat converting materials.

<Hydrophobicizing Precursor Made of Composite Particles>

The hydrophobicizing precursor made of composite composition will be further described hereinafter. A particularly preferred form of the hydrophobicizing precursor made of composite composition is a particulate composite material having a photo-heat converting agent and a hydrophobicizing precursor encapsulated therein. As far as there are no confusions, the particulate composite material itself and the hydrophobicizing precursor material to be encapsulated in the particulate composite material, too, are referred to as hydrophobicizing precursor. Preferred forms of the particulate composite material are the following forms (1) and (2), but the invention should not be construed as being limited thereto.

(1) A precursor which is a fine dispersion of composite composition having a photo-heat converting agent and a hydrophobicizing precursor encapsulated in its core and comprising a surface-hydrophilic surface portion, which breaks in shape due to heat developed by irradiation with light and consequent photo-heat conversion to release the hydrophobic material that then hydrophobicizes the neighbors thereof.

(2) A precursor which is a fine dispersion of surface-hydrophilic heat-crosslinkable material that initiates crosslinking reaction when acted upon by heat to become hydrophobic. These precursors will be further described hereinafter.

Examples of the form of particle of (1) fine dispersion of composite composition having a hydrophobicizing material encapsulated in its core and comprising a surface-hydrophilic surface portion include (a) so-called particulate material having a hetero condensation surface layer having a thermoplastic resin which softens or melts at a temperature caused by imagewise exposure in a heat mode and a photo-heat converting agent encapsulated therein and a hydrophilic sol particle layer condensed and attached to the surface thereof (hereinafter also referred to as “hetero condensation surface layer particle”), (b) composite particulate material of surface hetero phase having a hydrophilic gel surface layer formed thereon which has been obtained by sol-gel conversion caused by treating the surface of a core portion having a resin and a photo-heat converting agent encapsulated therein with a sol-gel converting material (hereinafter also referred to as “surface heterophase particle”), (c) core-shell type composite particulate material having a hydrophilic polymer layer formed around a hydrophobic particulate thermoplastic polymer obtained by dispersion polymerization and a hydrophobicizing precursor as a core (hereinafter also referred to as “core-shell type particle”), (d) particulate emulsion having a mixture of a heat-diffusible or thermoplastic hydrophobic organic compound and a photo-heat converting agent co-emulsion dispersed in a hydrophilic medium (hereinafter also referred to as “hydrophobic organic material-encapsulated particle”), and (e) microcapsule particle having as a core material a hydrophobic precursor and a photo-heat converting agent protected by a surface-hydrophilic wall material (hereinafter also referred simply to as “microcapsule particle”).

An example of the aforementioned fine dispersion of composite material which becomes hydrophobic when heat crosslinking begins (2) is a dispersion of a mixture of a polymerizable monomer, a crosslinkable compound, a photo-heat converting agent and a heat polymerization initiator.

Hetero Condensation Surface Layer Particle

A hetero condensation surface layer particle has emulsion-polymerized dispersion particles of heat-softening or heat-fusible resin obtained by emulsion dispersion of monomer protected by a surface active agent micelle encapsulated therein. A photo-heat converting agent has been added to the mixture to been capsulated prior to emulsion. The heat effect developed by irradiation with light and the photo-heat converting agent causes the particulate resin to soften and melt, destroying the hydrophilic surface layer and hence hydrophobicizing the neighbor which has been present as particle. The hydrophilic surface layer is a protective layer which comprises a fine sol dispersion having an extremely high hydrophilicity such as particulate silica and particulate alumina incorporated in an emulsion-dispersed dispersion of resin in such an arrangement that the dispersion is adsorbed to the periphery of resin particles. The fine sol dispersion is the same as the particulate sol material described later as ingredient to be incorporated in the medium of the hydrophilic image-recording layer.

Surface Hetero Phase Particle

A hetero phase particle is a hydrophilically-surfaced particle obtained by treating the surface of emulsion-dispersed dispersion particle of heat-softening or heat-fusible resin obtained similarly in the presence of a photo-heat converting agent with a sol-gel converting material described with reference to the medium of the hydrophilic image-recording layer so that a gel phase is formed on the surface of the particle.

Core-shell Type Particle

A core-shell type particle is prepared by the emulsion polymerization of a fine dispersion of a resin which softens or melts when acted upon by heat (hereinafter also referred to as “thermoplastic resin”) as a monomer. The photo-heat converting agent is added to the polymerization system before or after emulsion polymerization. A hydrophilic monomer is added to the mixed dispersion as a core particle (seed) so that it is polymerized to the surface of the core particle to obtain a hetero phase core-shell type hydrophilically-surfaced particle. The monomer constituting the core particle is selected from hydrophobic thermoplastic resins among the group of monomer components A to H for polymer compound described with reference to the hydrophobic precursor having a single composition. Similarly, the monomer constituting the hydrophilic shell phase can be selected from hydrophilic monomers having hydrophilic substituents, including carboxyl group, in addition to the monomers A to H.

Hydrophobic Organic Material-encapsulated Particle

The hydrophobic organic material-encapsulated particle is an oil-in-water dispersion type (O/W type) hydrophilically-surfaced particulate composite material having a hydrophobic material encapsulated emulsion-dispersed therein. The particle which has been emulsified by the action of heat developed by irradiation with light in a heat mode cannot maintain its particle shape, causing elution with medium, diffusion in medium or dissolution in medium and hence hydrophobicizing the neighbor of the precursor. The aforementioned hydrophobic organic low molecular compounds and organic high molecular compounds include those attaining this purpose.

The particulate composite material may be composed of an organic low molecular compound or high molecular compound alone but may be composed of both the two compounds. The particulate composite material may further comprise a third component incorporated therein for the purpose of enhancing the affinity of the two compounds. The oil-in-water type emulsion dispersion having a photo-heat converting agent and an organic hydrophobicizing precursor encapsulated therein can be prepared by a known preparation method as disclosed in “Kagaku Binran Oyohen (Handbook of Chemistry; Edition of Application (II))”, The Chemical Society of Japan, pp. 1212–1213, 1357–1364.

In order to render the surface of a particulate composite material hydrophilic, the surface hydrophilicizing method described above with reference to the method for adjusting the surface hydrophilicity and hydrophobicity of a photo-heat converting agent may be used as well. For example, a hydrophilic surface active agent having adsorptivity to the hydrophobicizing precursor can be added to the particulate composite material to form a hydrophilic surface adsorptive layer on the surface of the particle, causing fine dispersion. Alternatively, a method involving the provision of a protective colloidal hydrophilic and surface-adsorptive polymer film such as gelatin, polyvinyl alcohol and polyvinyl pyrrolidone, a dispersion method involving the inclusion of a surface active agent in the aforementioned method for further hydrophilicizing and stabilizing the surface of the particle, and method which comprises treating the surface of the particle with a material having a hydrophilic group reactive with the constituent of the particle may be used.

The total amount of the hydrophobic constituents (core materials) in the various surface-hydrophilic particulate composite material is preferably from 10% to 95% by weight, more preferably from 20% to 80% by mass based on the total amount of particulate composite material. In the case where both the organic low molecular compound and organic high molecular compound are used, their ratio is arbitrary. On the other hand, the ingredients constituting the hydrophilic surface layer are different from surface active agent, protective colloid, hydrophilic polymer resin, hydrophilic sol and sol-gel converting component. The ingredients constituting the hydrophilic surface layer may be distributed in the medium of the hydrophilic layer. The amount of the particulate composite material constituting the surface layer is from 5% to 80% by mass, preferably from 10% to 50% by mass based on the total amount of the particulate composite material. The volume-average size of the dispersion particles is preferably adjusted to a range of from not smaller than 0.01 $\mu$m to not greater than 5 $\mu$m, more preferably from 0.05 $\mu$m to 2 $\mu$m, particularly from 0.2 $\mu$m to 0.5 $\mu$m.

Microcapsule Particle

The particulate composite material constituting the microcapsule which hydrophobicizes the neighbor of the capsule when the capsule is thermally destroyed will be described hereinafter. The microcapsule to be used in the invention can be prepared by any known method. In some detail, a hydrophobicizing precursor or a mixture of the hydrophobicizing precursor, a photo-heat converting solid particle and an organic solvent can be encapsulated in a capsule to prepare a microcapsule dispersion having a wall membrane made of a polymer material formed around oil droplets. Alternatively, in the case where the photo-heat converting agent is a dye, the photo-heat converting agent may be molecularly dispersed in the form of solution in an organic solvent. Specific examples of the polymer material constituting the wall membrane of the microcapsule include polyurethane resin, polyurea resin, polyamide resin, polyester resin, polycarbonate resin, aminoaldehyde resin, melamine resin, polystyrene resin, styrene-acrylate copolymer resin, styrene-methacrylate copolymer resin, gelatin, and polyvinyl alcohol. Particularly preferred among these wall membrane materials is polyurethane-polyurea resin.

The microcapsule having a wall made of a polyurethane polyurea resin can be prepared by mixing a wall material such as polyvalent isocyanate with a core material in which it is to be encapsulated, emulsion-dispersing the mixture in an aqueous medium having a protective colloid such as polyvinyl alcohol therein, and then raising the temperature of the dispersion so that a polymer formation reaction occurs at oil droplet interface.

Specific examples of the polyvalent isocyanate compound include diisocyanates such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-diphenylmethane-4,4'-diisocyanate, diphenylmethane-4,4'-diisocyanate, 3,3'-diphenylmethane-4,4'-diisocyanate, xylene-1,4-diisocyanate, 4,4'-diphenylpropanediisocyanate, trimethylene diisocyanate, hexamethylene diisocyanate, propylene-1,2-diisocyanate, butylene-1,2-diisocyanate, cyclohexylene-1,2-diisocyanate and cyclohexylene-1,4-diisocyanate, triisocyanates such as 4,4',4"-triphenylmethane triisocyanate and toluene-2,4,6-triisocyanate, tetraisocyanates such as 4,4'-dimethyldiphenylmethane-2,2',5,5'-tetraisocyanate, and isocyanate prepolymers such as adduct of hexamethylene diisocyanate and methylolpropane, adduct of 2,4-tolylene diisocyanate and trimethylol propane, adduct of xylylene diisocyanate and trimethylol propane and adduct of tolylene diisocyanate and hexane triol. However, the invention is not limited to these compounds. If necessary, these compounds may be used in combination of two or more thereof. Particularly preferred among these compounds are those having three or more isocyanate groups per molecule.

In the case where the photo-heat converting agent is a particulate solid, the particulate material is emulsion-dispersed in the form of mixture with an organic solvent to encapsulate itself in a capsule. As the organic solvent there may be used any of the following various solvents. In some detail, high boiling oils may be used. Examples of these high boiling oils include high boiling oils such as phosphoric acid ester, phthalic acid ester, acrylic acid ester, methacrylic acid ester, other carboxylic acid esters, aliphatic acid amide, alkylated biphenyl, alkylated terphenyl, alkylated naphthalene, diarylethane, and chlorinated paraffin. Specific examples of tricresyl phosphate, trioctyl phosphate, octyl diphenyl phosphate, tricyclohexyl phosphate, dibutyl phthalate, dioctyl phthalate, dilaurate phthalate, dicyclohexyl phthalate, butyl oleate, diethylene glycol benzoate, dioctyl sebacate, dibutyl sebacate, dioctyl adipate, trioctyl trimelliate, acetyl triethyl citrate, octyl maleate, dibutyl maleate, isoamyl biphenyl, chlorinated paraffin, diisopropyl naphthalene, 1,1'-ditolylethane, 2,4-ditertiaryamylphenol and N,N-dibutyl-2-butoxy-5-tertiaryoctylaniline. Specific examples of auxiliary solvents include ethyl acetate, isopropyl acetate, butyl acetate, methylene chloride, and cyclohexanone. Additives such as hindered phenol, hindered amine and hydroquinone derivative maybe added to the aforementioned mixed solvent.

Examples of the protective colloid to be used on the dispersing medium part during microcapsulization include gelatin, gelatin derivative, polyvinyl alcohol, cellulose derivative such as hydroxymethyl cellulose and carboxymethyl cellulose, and casein. As the polymer material to be added to the wall material component during the emulsion dispersion of microcapsule core there may be used any of the aforementioned various colloids.

As the capsule wall material there may be used any of gelatin, polyurea, polyurethane, polyimide, polyester, polycarbonate and melamine, which are described above. A polyurea or polyurethane wall is preferably used to obtain a heat-responsible microcapsule. In order to render the capsule wall heat-responsible, it is preferred that the capsule wall have a glass transition point of from not lower than room temperature to not higher than 200° C., particularly from 70° C. to 150° C.

The glass transition temperature of the capsule wall can be controlled by predetermining the kind of the polymer constituting the capsule wall or adding proper additives to the wall material. Examples of the auxiliaries include phenol compound, alcohol compound, amide compound, and sulfonamide compound. These auxiliaries may be incorporated in the core material of capsule or added to the exterior of microcapsule in the form of dispersion.

For ordinary methods for microcapsulization and materials to be used therefor, reference can be made to U.S. Pat. Nos. 3,726,804 and 3,796,696, which can be applied to the invention.

As the core material of microcapsule there may be used the low molecular organic compound or high molecular organic compound described in Clause (1) with reference to hydrophobicizing precursor of single composition besides the aforementioned materials.

The amount of the core material and wall material other than photo-heat converting agent is preferably from 10% to 300% by mass, more preferably from 20% to 200% by mass, particularly from 30% to 150% by mass based on the photo-heat converting agent. The volume-average size of the microscapsule is preferably adjusted to from not smaller than 0.1 μm to not greater than 20 μm, more preferably from 0.2 μm to 0.7 μm from the standpoint of enhancement of resolution and handleability. For the measurement of particle diameter, a Type LA-910 particle diameter measuring device (produced by Horiba Seisakusho Co., Ltd.) was used.

(2) Particulate Composite Material Comprising a Polymerizable Monomer and a Crosslinkable Compound Which Forms a Hydrophobic Polymer/crosslinked Structure in the Vicinity of Particles Upon Thermal Destruction This particulate composite material described in Clause (2) is a dispersion containing a polymerizable monomer/crosslinkable compound system and a photo-heat converting agent which doesn't react at ordinary temperature but, when acted upon by heat, beings to undergo polymerization reaction to hydrophobicize the neighbors of the precursor. Examples of the polymerizable monomer/crosslinkable compound system include a system containing a polymerizable monomer which undergoes polymerization reaction, particularly crosslinking reaction, at high temperatures, a heat-crosslinkable polymer or oligomer having a crosslinking group and a heat polymerization initiator.

Examples of the polymerizable monomer and crosslinkable compound to be encapsulated in the particulate composite material of the invention include isocyanates such as phenyl isocyanate, 2,4-tolylene diisocyanate, 2,6-tolylene diisocyanate, 4,4'-diphenylmethane diisocyanate, 3,3'-dimethylbiphenyl-4,4'-diisocyanate, 1,5-naphthalene diisocyanate, tolylene diisocyanate, 1,6-hexamethylene diisocyanate, isophorone diisocyanate, xylylene diisocyanate, lysine diisocyanate, triphenylmethane trilsocyanate, bicycloheptane triisocyanate, tridene diisocyanate, polymethylene polyphenyl isocyanate and polymellic polyisocyanate, polyisocyanates such as 1:3 adduct (by mol) of trimethylolpropane and the aforementioned diisocyanate such as 1,6-hexane diisocyanate and 2,4-tolylene diisocyanate, iscyanate compounds such as oligomer or polymer of 2-isocyanatoethyl (meth)acrylate, polyfunctional (meth)acryl monomers such as N,N'-methylene bisacrylamide, (meth)acryloyl morpholine, vinyl pyridine, N-methyl (meth)acrylamide, N,N'-dimethyl (meth) acrylamide, N,N'-dimethylaminopropyl (meth)acrylamide, N,N'-dimethylaminoethyl (meth)acrylate, N,N'-diethylaminoethyl (meth)acrylate, N,N'-dimethylaminoneopentyl (meth)acrylate, N-vinyl-2-pyrrolidone, diacetone acrylamide, N-methylol (meth) acrylamide, parastyrenesulfonic acid, salts thereof, methoxytriethylene glycol (meth)acrylate, methoxytetraethylene glycol (meth)acrylate, methoxypolyethylene glycol (meth)acrylate (number-average molecular weight of PEG: 400), methoxypolyethylene glycol (meth)acrylate (number-average molecular weight of PEG: 1,000), butoxyethyl (meth)acrylate, phenoxyethyl (meth)acrylate, phenoxydiethylene glycol (meth)acrylate, phenoxyethylene glycol (meth) acrylate, phenoxypolyethylene glycol (meth)acrylate, nonylphenoxyethyl (meth)acrylate, dimethyloltricyclodecane di(meth)acrylate, diethylene glycol (meth)acrylate, tetraethylene glycol di(meth)acrylate, polyethylene glycol di(meth) acrylate (number-average molecular weight of PEG: 400), polyethylene glycol di(meth)acrylate (number-average molecular weight of PEG: 600), polyethylene glycol di(meth)acrylate (number-average molecular weight of PPG: 1,000), polypropylene glycol di(meth)acrylate (number-average molecular weight of PPG: 400), 2,2-bis[4-(methacryloxyethoxy)phenyl]propane, 2,2-bis[4-(methacryloxy.diethoxy)phenyl]propane, 2,2-bis[4-methacryloxypolyethoxy]phenyl]propane, acrylation product thereof, β-(meth)acryloyloxyethyl hydrogen phthalate, β-(meth)acryloyloxy ethyl hydrogen succinate, polyethylene glycol mono(meth)acrylate, polypropoylene glycol mono(meth)acrylate, 3-chloro-2-hydroxypropyl (meth)acrylate, 1,3-butylene glycol di(meth)acrylate, 1,6-hexanediol (meth)acrylate, neopentyl glycol di(meth) acrylate, trimethylol proopane tri(meth)acrylate, tetramethylolmethane tri(meth)acrylate, tetramethylolmethane tetra (meth)acrylate, isobornyl (meth)acrylate, lauryl (meth) acrylate, tridecyl (meth)acrylate, stearyl (meth)acrylate, isodecyl (meth)acrylate, cyclohexyl (meth)acrylate, tetrafurfuryl (meth)acrylate, benzyl (meth)acrylate, mono(2-acryloyloxyethyl) acid phosphate, methacrylation product thereof, glycerin mono(meth)acrylate, glycerin di(meth) acrylate, tris(2-acryloxyethyl)isocyanurate, methacrylation product thereof and 2-isocyanatoethyl (meth)acrylate, and combination of these polyfunctional (meth)acryl monomers with monofunctional (meth)acrylates.

In the case where these polymerizable or crosslinkable compounds are used, a heat polymerization initiator is preferably added to accelerate the effect of heat. Examples of the heat polymerization initiator employable herein include peroxides such as methyl ethyl ketone peroxide, cyclohexanone peroxide, n-butyl-4,4-bis(t-butylperoxy) valerate, 1,1-bis(t-butylperoxy)cyclododecane, 2,2-bis(t-butylperoxy)butane, cumene hydroperoxide, p-menthane hydroperoxide, t-hexylperoxy benzoate, t-butylperoxy benzoate and t-butylperoxy acetate.

The amount of these polymerizable or crosslinkable organic compounds to be added is preferably from 5% to 95% by mass, more preferably from 20% to 90% by mass, most preferably from 30% to 80% by mass based on the total solid content weight of particulate composite materials. The amount of the heat polymerization catalyst to be added is not greater than 50%, preferably not greater than 30%, more preferably from 1% to 10% based on the added amount of the polymerizable or crosslinkable organic compound.

The amount of these polymerizable or crosslinkable organic compounds to be added is preferably from 10% to 300% by mass, more preferably from 20% to 200% by mass, most preferably from 30% to 100% by mass based on the particulate photo-heat converting materials. The amount of the heat polymerization catalyst to be added is not greater than 50%, preferably not greater than 30%, more preferably from 1% to 10% based on the added amount of the polymerizable or crosslinkable organic compounds.

(Hydrophilic Binder)

The hydrophilic binder to be incorporated in the image-recording layer comprising a particulate composite material having a hydrophobicizing precursor and a photo-heat converting agent incorporated therein according to the invention will be described hereinafter.

The hydrophilic binder is a sol-gel converting material made of a system of hydrophilic polymer, metal hydroxide and metal oxide. In the case where the surface hydrophilic layer of the aforementioned inorganic particles modified with a hydrophilic polymer, particularly inorganic particles modified with a surface modifier having a crosslinked structure or particulate surface-hydrophilic composite photo-heat converting agent, acts also as a binder, it is not necessary that a binder be newly used. The binder acts as a dispersing medium for constituents of hydrophilic layer to accomplish various purposes, e.g., of enhancing the physical strength of layer, enhancing the dispersibility of compositions constituting layer, enhancing the coatability, enhancing the printability and improving the convenience in plate making. A photo-heat converting material which can be molecularly dispersed in a hydrophilic medium such as the aforementioned hydrophilic infrared-absorbing dye may be dissolved in or attached to a medium.

It is particularly preferred that the hydrophilic image-recording layer be of sol-gel converting system. In particular, a sol-gel converting system capable of forming a gel structure of polysiloxane is desirable.

<Medium of Sol-gel Converting System>

A particularly preferred medium for the image-recording layer of the invention is a sol-gel converting system described later. In some detail, this sol-gel converting system stays sol when it is in the form of coating solution. However, this sol-gel converting system becomes gel with time after applied and dried and then can be applied to printing plate. The sol-gel converting system which can be preferably used in the invention is a polymer having a network structure formed by connecting groups made of polyvalent elements with oxygen atoms mixed with a resin structure having polyvalent metals with unbonded hydroxyl groups and alkoxy groups. The sol-gel converting system stays sol when it has much alkoxy groups and hydroxyl groups before application. As the ester bonding proceeds after applied, the network resin structure of the system strengthens to render the system gel. The system not only changes in hydrophilicity of resin structure but also acts to change the hydrophilicity of solid particles by allowing some of the hydroxyl groups to be bonded to the solid particles and hence modify the surface thereof. Examples of the polyvalent elements to be bonded to the sol-gel converting compound having hydroxyl group or alkoxy group include aluminum, silicon, titanium, and zirconium. All these elements can be used in the invention. A sol-gel converting system formed by siloxane bond which can be used most preferably will be described hereinafter. The sol-gel conversion using aluminum, titanium and zirconium can be accomplished in the same manner as described below except that silicon is replaced by the respective element.

The system utilizing sol-gel conversion will be further described hereinafter. The inorganic hydrophilic matrix formed by sol-gel conversion is preferably a resin having a siloxane bond and a silanol group. The image-recording layer of the lithographic printing plate precursor of the invention is formed by applying a coating solution which is a system of sol containing a silane compound having at least one silanol group to a substrate, and then allowing the silanol group to undergo hydrolytic condensation with time, causing the formation of a siloxane skeleton structure that causes gelation. The matrix of gel structure may comprise the aforementioned hydrophilic polymer or crosslinking agent incorporated therein for the purpose of improving the physical properties such as film strength and flexibility and the coatability and adjusting the hydrophilicity. The siloxane resin forming the gel structure is represented by the following general formula (I). The silane compound having at least one silanol group is represented by the general formula (III). The material system which converts from hydrophilicity to hydrophobicity to be incorporated in the image-recording layer doesn't necessarily need to be a silane compound represented by the general formula (III), singly, but normally may be made of an oligomer obtained by partial hydrolytic polymerization of silane compound or may be made of a mixture of silane compound and its oligomer.

(I)

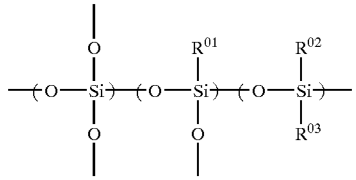

The siloxane-based resin of the general formula (I) is formed by sol-gel conversion of a dispersion containing at least one silane compound represented by the following general formula (III). In the general formula (I), at least one of $R^{01}$ to $R^{03}$ represents a hydroxyl group, and the others each represent an organic residue selected from $R^0$ and $Y^1$ in the following general formula (III).

$$(R^0)_nSi(Y^1)_{4-n} \quad \text{(III)}$$

wherein $R^0$ represents a hydroxyl group, hydrocarbon group or heterocyclic group; $Y^1$ represents a hydrogen atom, halogen atom, —$OR^{11}$, —$OCR^{12}$ or —$N(R^{13})(R^{14})$ (in which $R^{11}$ and $R^{12}$ each represent a hydrocarbon group, and $R^{13}$ and $R^{14}$may be the same or different and each represent a hydrogen atom or hydrocarbon group); and n represents an integer of from 0 to 3.

Examples of the hydrocarbon group or heterocyclic group represented by $R^0$ in the general formula (III) include $C_1$–$C_{12}$ straight-chain or branched alkyl group which may be substituted (e.g., methyl group, ethyl group, propyl group, butyl group, pentyl group, hexyl group, heptyl group, octyl group, nonyl group, decyl group, dodecyl group; Examples of substituents on these groups include halogen atom (e.g., chlorine atom, fluorine atom, bromine atom), hydroxyl group, thiol group, carboxyl group, sulfo group, cyano group, epoxy group, —OR' group (R' represents a methyl group, ethyl group, propyl group, butyl group, heptyl group, hexyl group, octyl group, decyl group, propenyl group, butenyl group, hexenyl group, octenyl group, 2-hydroxyethyl group, 3-chloropropyl group, 2-cyanoethyl group, N,N-dimethylaminoethyl group, 2-bromoethyl group, 2-(2-methoxyethyl)oxyethyl group, 2-methoxycarbonylethyl group, 3-carboxypropyl group or benzyl group), —OCOR" group (in which R" has the same meaning as R'), —COOR" group, —COR" group, —N(R''') (R''') (in which R'''’s may be the same or different and represents a hydrogen atom or has the same meaning as R'), —NHCONHR" group, —NHCOOR" group, —$Si(R'')^3$ group, —CONHR''' and —NHCOR" group; The alkyl group may be substituted by a plurality of these substituents), $C_2$–$C_{12}$ straight-chain or branched alkenyl group which may be substituted (e.g., vinyl group, propenyl group, butenyl group, pentenyl group, hexenyl group, octenyl group, decenyl group, dodecenyl group; Examples of the substituents on these groups include those listed above with reference to the alkyl group), $C_7$–$C_{14}$ aralkyl group which may be substituted (e.g., benzyl group, phenethyl group, 3-phenylpropoyl group, naphthylmethyl group, 2-naphthylethyl group; Examples of the substituents on these groups include those listed above with reference to the alkyl group; The aralkyl group may be substituted by a plurality of these substituents), $C_5$–$C_{10}$ alicyclic group which may be substituted (e.g., cyclopentyl group, cyclohexyl group, 2-cyclohexylethyl group, 2-cyclopentylethyl group, norbonyl group, adamanthyl group; Examples of the substituents on these groups include those listed above with reference to the alkyl group; The alicyclic group may be substituted by a plurality of these substituents), $C_6$–$C_{12}$ aryl group which may be substituted (e.g., phenyl group, naphthyl group; Examples of the substituents on these groups include those listed above with reference to the alkyl group; The aryl group may be substituted by a plurality of these substituents), and heterocyclic group containing at least one atom selected from the group consisting of nitrogen atom, oxygen atom and sulfur atom which can be condensed (e.g., pyrane ring, furane ring, thiophene ring, morpholine ring, pyrrole ring, thiazole ring, oxazole ring, pyridine ring, piperidine ring, pyrrolidone ring, benzothiazole ring, benzoxazole ring, quinoline ring, tetrahydrofurane ring; These heterocyclic groups may contain substituents. Examples of the substituents on these groups include those listed above with reference to the alkyl group; The heterocyclic group may be substituted by a plurality of these substituents).

Examples of —$OR^{11}$group, —$OCOR^{12}$ group or —$N(R^{13})(R^{14})$ group represented by $Y^1$ in the general formula (III) include the following groups. In —$OR^{11}$ group, $R^{11}$ represents a $C_1$–$C_{10}$ aliphatic group which may be substituted (e.g., methyl group, ethyl group, propyl group, butoxy group, heptyl group, hexyl group, pentyl group, octyl group, nonyl group, decyl group, propenyl group, butenyl group, heptenyl group, hexenyl group, octenyl group, decenyl group, 2-hydroxyethyl group, 2-hydroxypropyl group, 2-methoxyethyl group, 2-(methoxy ethyloxo)ethyl group, 2-(N,N-diethylamino)ethyl group, 2-methoxy propyl group, 2-cyanoethyl group, 3-methyloxapropyl group, 2-chloroethyl group, cyclohexyl group, cyclopentyl group, cyclooctyl group, chlorocyclohexyl group, methoxycyclohexyl group, benzyl group, phenethyl group, dimethoxybenzyl group, methylbenzyl group, bromobenzyl group).

In —$OCOR^{12}$ group, $R^{12}$ represents the same aliphatic group as $R^{11}$ or $C_6$–$C_{12}$ aromatic group which may be substituted (Examples of the aromatic group include those listed above with reference to the aryl represented by R). In —$N(R^{13})(R^{14})$ group, $R^{13}$ and $R^{14}$ may be the same or different and each represent a hydrogen atom or $C_1$–$C_{10}$ aliphatic group which may be substituted (same as $R^{11}$ in —$OR^{11}$ group). More preferably, the sum of the number of carbon atoms in $R^{11}$ and $R^{12}$ is 16 or less. Specific examples of the silane compound represented by the general formula (III) will be given below, but the invention should not be construed as being limited thereto.

Tetrachlorosilane, tetrabromosilane, tetramethoxysilane, tetraethoxysilane, tetraisopropoxysilane, tetrabutoxysilane, methyl trichlorosilane, methyl tribromosilane, methyl trimethoxysilane, methyl triethoxysilane, methyl triisopropoxysilane, methy tri-t-butoxysilane, ethyl trichlorosilane, ethyl tribromosilane, ethyl trimethoxysilane, ethyl triethoxysilane, ethyl triisopropoxysilane, ethyl tri-t-butoxysilane, n-propyl trichlorosilane, n-propyl tribromosilane, n-propyl trimethoxysilane, n-propyl triethoxysilane, n-propyl triisopropoxysilane, n-propyl tri-t-butoxysilane, n-hexyl trichlorosilane, n-hexyl tribromosilane, n-hexyl trimethoxysilane, n-hexyl triethoxysilane, n-hexyl triisopropoxysilane, n-decyl tribromosilane, n-decyl trimethoxysilane, n-decyl triethoxysilane, n-decyl triisopropoxysilane, n-decyl tri-t-butoxysilane, n-octanedecyl trichlorosilane, n-octadecyl tribromosilane, n-octadecyl trimethoxysilane, n-cotadecyl triethoxysilane, n-octadecyl triisopropoxysilane, n-octadecyl tri-t-butoxysilane, phenyl trichlorosilane, phenyl tribromosilane, phenyl trimethoxy silane, phenyl triethoxysilane, phenyl triisopropoxysilane, phenyl tri-t-butoxysilane, dimethoxy diethoxysilane, dimethyl dichlorosilane, dimethyl dibromosilane, dimethyl dimethoxysilane, dimethyl diethoxysilane, diphenyl dichlorosilane, diphenyl dibromosilane, diphenyl dimethoxysilane, diphenyl diethoxysilane, phenyl methyldichlorosilane, phenyl methyldibromosilane, phenyl methyldimethoxysilane, phenyl methyldiethoxysilane, triethoxyhydrosilane, tribromohydrosilane, trimethoxyhydrosilane, isopropoxyhydrosilane, tri-t-butoxyhydrosilane, vinyl triethoxysilane, vinyl tribromosilane, vinyl trimethoxysilane, vinyl triethoxysilane, vinyl triisopropoxysilane, vinyl tri-t-butoxysilane, trifluoropropyl trichlorosilane, trifluoropropyl tribromosilane, trifluoropropyl trimethoxysilane, trifluoropropyl triethoxysilane, trifluoropropyl triisopropoxysilane, trifluoropropyl tri-t-butoxysilane, γ-glycidoxypropylmethyldimethoxysilane, γ-glycidoxypropyl methyl diethoxysilane, γ-glycidoxypropyl trimethoxysilane, γ-glycidoxypropyl triethoxysilane, γ-glycidoxypropyl triisopropoxysilane, γ-glycidoxypropyl tri-t-butoxysilane, γ-methacryloxypropyl methyl dimethoxysilane, γ-methacryloxypropyl trimethoxysilane, γ-methacryloxypropyl triisopropoxysilane, γ-methacryloxypropyltri-t-butoxysilane, γ-aminopropyl methyl dimethoxysilane, γ-aminopropyl methyl diethoxysilane, γ-aminopropyltrimethoxysilane, γ-aminopropyltriethoxysilane, γ-aminopropyl triisopropoxysilane, γ-aminopropyl tri-t-butoxysilane, γ-mercaptopropylmethyldimethoxysilane, γ-mercaptopropyl methyl diethoxysilane, γ-mercaptopropyl trimethoxysilane, γ-mercaptopropyl triethoxysilane, γ-mercaptopropyl triisopropoxysilane, γ-mercaptopropyl tri-t-butoxysilane, β-(3,4-epoxycyclohexyl)ethyl trimethoxysilane, β-(3,4-epoxycyclohexyl)ethyl triethoxysilane.

A metal compound which can be bonded to the resin during sol-gel conversion to form a film such as Ti, Zn, Sn, Zr and Al can be used in combination with the silane compound represented by the general formula (III) to be used in the formation of the image-recording layer of the invention. Examples of the metal compound employable herein include $Ti(OR'')_4$ (in which R" represents a methyl group, ethyl group, propyl group, butyl group, pentyl group or hexyl group), $TiCl_4$, $Zn(OR'')_2$, $Zn(CH_3COCHCOCH_3)_2$, $Sn(OR'')_4$, $Sn(CH_3COCHCOCH_3)_4$, $Sn(OCOR'')_4$, $SnCl_4$, $Zr(OR'')_4$, $Zr(CH_3COCHCOCH_3)_4$, and $Al(OR'')_3$.

In order to accelerate the hydrolysis and polycondensation reaction of the silane compound represented by the general formula (III) and the aforementioned metal compound used in combination therewith, the aforementioned metal complex catalyst is used in an amount falling within the above defined range. In addition to the metal complex catalyst, an acidic catalyst or basic catalyst maybe used. In this case, an acid or basic compound is used as it is or in the form of solution in water or a solvent such as alcohol (hereinafter referred to as "acidic catalyst" or "basic catalyst", respectively). The concentration of the catalyst is not specifically limited. When the concentration of the catalyst is high, it gives a tendency that the hydrolysis rate and polycondensation rate increase. However, when a high concentration basic catalyst is used, precipitates may be produced in the sol solution. Therefore, the concentration of the basic catalyst is preferably not higher than 1 N (as calculated in terms of concentration in aqueous solution).

The kind of the acidic catalyst or basic catalyst to be used in combination with the aforementioned ingredients is not specifically limited. Examples of the acidic catalyst employable herein include halogenated hydrogen such as hydrochloric acid, nitric acid, sulfuric acid, sulfurous acid, phosphoric acid, hydrogen sulfide, perchloric acid, hydrogen peroxide, carbonic acid, carboxylic acid such as formic acid and acetic acid, substituted carboxylic acid obtained by substituting R in the structure represented by RCOOH by other elements or substituents, and sulfonic acid such as benzenesulfonic acid. Examples of the basic catalyst employable herein include ammoniacal base such as aqueous ammonia, and amines such as ethylamine and aniline.

As mentioned above, the image-recording layer prepared by sol-gel method is suitable particularly for the lithographic printing plate precursor of the invention. For the details of the aforementioned sol-gel method, reference can be made to Sumio Sakka, "Zoru-Geru Ho no Kagaku (Science of Sol-Gel Method)", Agne Shofusha, 1988, Yutaka Hirashima, "Saishin Zoru-Geru Ho ni yoru Kinosei Hakumaku Sakusei Gijutsu (Technique for Preparation of Functional Thin Film by Modern Sol-Gel Method)", General Technique Center, 1992, etc.

<Hydrophilic Polymer Binder>

As the polymer compound to be incorporated in the image-recording layer of the lithographic printing plate precursor of the invention there may be used an organic polymer compound having a hydroxyl group for the purpose of providing a strength and a surface hydrophilicity suitable for image-recording layer. Specific examples of the organic polymer compound employable herein include water-soluble resins such as polyvinyl alcohol (PVA), modified PVA (e.g., carboxy-modified PVA), starch, starch derivative, cellulose derivative (e.g., carboxymethyl cellulose, hydroxyethyl cellulose), casein, gelatin, polyvinyl pyrrolidone, vinyl acetate-crotonic acid copolymer, styrene-maleic acid copolymer and water-soluble acrylic copolymer containing as main constituent a water-soluble acrylic monomer (e.g., polyacrylic acid, salt thereof, polyacrylamide, acrylic acid, acrylamide).

The amount of these polymer to be added is preferably from 0.01 to 50% by mass, more preferably from 0.1 to 30% by mass, most preferably from 1 to 20% by mass, based on the total solid content weight of particulate composite material.

Examples of the water-resisting agent for crosslinking and hardening the organic polymer compound having a hydroxyl group include glyoxal, initial condensate of aminoplast such as melamine formaldehyde resin and urea formaldehyde resin, methylolated polyamide resin, polyamide-polyamine-epichlorohydrin adduct, polyamide epichlorohydrin resin, and modified polyamide polyimide resin. A crosslinking catalyst such as ammonium chloride and silane coupling agent can be used in combination with these water-resisting agents.

[Coating]

The hydrophilic layer according to the invention can be prepared normally by dissolving the aforementioned components in a solvent, and then applying the solution to a proper support. The solvent to be used herein is not specifically limited. Examples of the solvent employable herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethyl formamide, tetramethylurea, N-methylpyrrolidone, dimethyl sulfoxide, sulfolane, γ-butyrolactone, toluene, and water.

These solvents are used singly or in admixture. The concentration of the aforementioned components (total solid content including additives) in the solvent is preferably from 1% to 50% by mass.

The coating solution may comprise a surface active agent for improving the coatability thereof such as fluorine-based surface active agent as disclosed in Japanese Patent Laid-Open No. 1987-170950 incorporated therein. The amount of such a surface active agent to be incorporated in the coating solution is preferably from 0.01% to 1% by mass, more preferably from 0.05% to 0.5% by mass based on the total solid content of the image-recording layer.

The amount of the coat layer (solid content) which has been applied to and dried on the support is preferably from 0.5 to 5.0 $g/m^2$. As the coating method there may be used any of various methods such as bar coating method, rotary coating method, spray coating method, curtain coating method, dip coating method, air knife coating method, blade coating method and roll coating method.

The drying step and post-heating (conditioning) step after coating are as previously mentioned.

The thickness of the hydrophilic layer of the invention is preferably from 0.001 $g/m^2$ to 10 $g/m^2$, more preferably from 0.01 $g/m^2$ to 5 $g/m^2$. The amount of the image-recording layer (solid content) which has been applied and dried depends on the purpose but is preferably from 0.5 to 5.0 $g/m^2$, more preferably from 0.5 to 2.0 $g/m^2$ for ordinary lithographic printing plate precursor.

When the amount of the image-recording layer falls within the above defined range, the hydrophilic effect of the invention can be fairly exerted. Further, the resulting adhesion to the support is good, making it possible to obtain a sufficient press life.

(Surface Protective Layer)

The surface of the lithographic printing plate precursor of the invention is hydrophilic and thus can be easily hydrophobicized by the effect of atmosphere, affected by temperature and humidity or mechanically damaged or stained during handling before use. The surface of the lithographic printing plate precursor is normally protected by a surface conditioner (also referred to as "gum solution") at the plate making step. The coating of the precursor with a protective solution during preparation is advantageous in that such a protection effect can be exerted shortly after preparation and the necessity of applying a surface conditioner at the plate making step can be eliminated to enhance the working efficiency. This effect can be remarkably exerted in the invention, which concerns a lithographic printing plate precursor having a hydrophilic surface.

The surface protective layer doesn't necessarily be needed. The composition of the surface protective layer, if provided, is substantially the same as that of the surface conditioner.

(Undercoat Layer)

In the invention, it is preferred that an undercoat layer be provided between the aforementioned support and hydrophilic layer. The undercoat layer which can be preferably used in the invention is an undercoat layer containing a hydrophilic binder and silica.

As the hydrophilic binder to be incorporated in the undercoat layer there may be normally used a protein, preferably gelatin. However, gelatin can be partly or entirely substituted by a synthetic, semi-synthetic or natural polymer. Examples of synthetic substitute for gelatin include polyvinyl alcohol, poly-N-vinylpyrrolidone, polyvinyl imidazole, polyvinyl pyrazole, polyacrylamide, polyacrylic acid, and derivative thereof, particularly copolymer thereof. Examples of natural substitute for gelatin include other proteins such as zein, albumin and casein, cellulose, saccharide, starch and alginate. Ordinary examples of semi-synthetic substitute for gelatin include denaturated natural product such as gelatin derivative obtained by converting gelatin with an alkylating agent or acylating agent or grafting gelatin with a polymerizable monomer and cellulose derivative such as hydroxyalkyl cellulose, carboxymethyl cellulose, phthaloyl cellulose and cellulose sulfate.

The silica to be incorporated in the aforementioned undercoat layer is preferably an anionic silicon dioxide. The colloidal silica preferably has a surface area of at least 100 $m^2/g$, more preferably at least 300 $m^2/g$.

The surface area of colloidal silica is measured by BET method published by S. Brunauer, P. H. Emmet and E. Teller in "J. Amer. Chem. Soc.", vol. 60, 1938, pp. 309–312.

The silica dispersion may comprise other materials such as aluminum salt, stabilizer and sterilizer incorporated therein.

Such a kind of silica is commercial available by the trade name of KIESELSOL 100, KIESELSOL 300 AND KIESELSOL 500 (KIESELSOL is a trade name of Farbenfabriken Bayer AG of Leverkusen, Germany; The figure indicates the surface area as calculated in terms of $m^2/g$).

The weight ratio of the hydrophilic binder to silica in the undercoat layer is preferably less than 1. The lower limit of the weight ratio of the hydrophilic binder is not so important but is preferably at least 0.2, more preferably from 0.25 to 0.5.

The coated amount of the undercoat layer is preferably from not smaller than 200 $mg/m^2$ to less than 750 $mg/m^2$, more preferably from 250 $mg/m^2$ to 500 $mg/m^2$.

The application of the aforementioned undercoat layer composition is preferably carried out by applying an aqueous colloidal dispersion optionally in the presence of a surface active agent.

[Other Layers]

The support comprises a back coat provided on the back side thereof. As such a back coat there is preferably used a coat layer made of an organic polymer compound disclosed in Japanese Patent Laid-Open No. 1993-45885 or a metal oxide obtained by the hydrolysis or polycondensation of an organic or inorganic metal compound disclosed in Japanese Patent Laid-Open No. 1994-35174. Among these coat layer materials, alkoxylated silicon compounds such as $Si(OCH_3)_4$, $Si(OC_2H_5)_4$, $Si(OC_3H_7)_4$ and $Si(OC_4H_9)_4$ are inexpensive and easily available. A coat layer of a metal oxide obtained from such an alkoxylated silicon compound has an excellent hydrophilicity and thus is particularly desirable.

[Support]

The support to be used herein is not specifically limited but is a dimensionally stable sheet-like material. Examples of such a sheet-like material include paper, paper laminated with a plastic (e.g., polyethylene terephthalate, polyethylene, polypropylene, polystyrene), metal plate (e.g., aluminum, zinc, copper), plastic film (e.g., cellulose diacetate, cellulose triacetate, cellulose nitrate, polyethylene terephthalate, polyethylene, polystyrene, polypropylene, polycarbonate, polyvinyl acetal), and paper or plastic film having the aforementioned metal laminated or vacuum-deposited thereon.

The support of the invention is preferably a polyester film or aluminum plate. Particularly preferred among these support materials is polyester film, which also acts as the surface of the support.

The aluminum plate which can be preferably used in the invention is a pure aluminum plate or an alloy plate comprising aluminum as a main component and a slight amount of foreign elements. The aluminum plate may also be a plastic film having aluminum laminated or vacuum-deposited thereon. Examples of the foreign elements to be incorporated in the aluminum alloy include silicon, iron, manganese, copper, magnesium, chromium, zinc, bismuth, nickel, and titanium. The content of foreign elements in the alloy is not greater than 10% by mass at most. Aluminum which can be particularly preferably used in the invention is pure aluminum. Since completely pure aluminum can be difficultly produced from the standpoint of refining technique, the aluminum plate may contain a slight amount of foreign elements. Thus, the aluminum to be used in the invention is not specifically limited in its composition. An aluminum plate made of material which has heretofore been known can be properly used. The thickness of the aluminum plate to be used herein is from about 0.1 mm to 0.6 mm, preferably from about 0.15 mm to 0.4 mm, particularly from about 0.2 mm to 0.8 mm.

In the invention, it is preferred that the support have a roughened surface as previously mentioned.

In order to provide the support with a roughened surface, various methods may be employed. For example, by mechanically rubbing the surface of the solid material with a sandblaster or brush, the surface of the solid material can be scraped to form indentations, providing a roughened surface. Alternatively, mechanical embossing can be effected to provide roughness. Further, gravure printing may be effected to form raised portions on the surface of the solid material, providing a roughened surface. Alternatively, a layer containing a particulate solid material (matting agent) may be formed on the surface of the solid material by coating or printing to provide a roughened surface thereon. The particulate solid material may be incorporated in a polymer film during the preparation of the polymer filmto form roughness on the surface of the polymer film. Alternatively, the solid material may be subjected to solvent treatment, corona discharge treatment, plasma treatment, irradiation with electron rays, irradiation with X rays or the like to roughen the surface thereof. The aforementioned treatments may be effected in combination. The method which comprises sandblasting or resin printing to form a roughened surface or the method which comprises incorporation of a particulate solid material to form roughness can be preferably effected in particular.

(Solid Particle Method)

As the aforementioned particulate solid material there may be used any of various materials such as particulate metal, particulate metal oxide and particulate organic high molecular or low molecular material. Specific examples of these particulate materials include copper powder, tin powder, iron powder, zinc oxide powder, silicon oxide powder, titanium oxide powder, aluminum oxide powder, molybdenum disulfide powder, calcium carbonate powder, clay, mica, cornstarch, boron nitride, particulate silicone resin, particulate polystyrene resin, particulate fluororesin, particulate acrylic resin, particulate polyester resin, particulate acrylonitrile copolymer, particulate zinc stearate, and particulate calcium behenate. The average particle diameter of these particulate materials is preferably not smaller than 0.05 $\mu m$, more preferably not smaller than 0.1 $\mu m$. In the case where a particulate material is attached to the surface of a sheet or a layer containing a particulate material is provided on the surface of a sheet, the average particle diameter of the particulate material substantially corresponds to the size of unevenness on the roughened surface. In the case where the particulate material is internally incorporated in the sheet, the size of unevenness on the roughened surface is determined by the average particle diameter of the particulate material and the thickness of the sheet. Accordingly, in the latter case, it is necessary that the optimum particle diameter be empirically determined by the combination of sheet and particulate material to obtain an optimum size of unevenness.

Specific examples of the method which comprises fixing a particulate solid material in the surface of a support to form unevenness include a method which comprises adding a particulate solid material before the formation of film, a method which comprises applying and drying a solution having a particulate solid material dispersed in a binder, a method which comprises pressing a particulate material into a film formed under a mechanical pressure, and a method which comprises electrodepositing a particulate solid material on the surface of a film formed.

Specific examples of the method which comprises adding a particulate solid material before the formation of film include the following method. A PET master batch having a pigment incorporated therein as a particulate solid material is melt-extruded, formed into a film on a cooling drum, stretched longitudinally and crosswise, and then subjected to heat treatment to obtain a roughened PET film. As the pigment there may be used titanium oxide, alumina and silica, singly or in combination of two or more thereof. The central line average surface roughness (Ra) of film can be adjusted by the particle diameter and content of the pigment to be incorporated in the film. For example, by incorporating a pigment having a particle diameter of from 1 $\mu$m to 10 $\mu$m in an amount of from 0.5% to 5% by mass, the central line average surface roughness of film can be adjusted. The greater the particle diameter of pigment is, the greater is the central line average surface roughness of film. In order to obtain the desired roughened surface, it is necessary that the particle diameter of the pigment be properly determined and the amount of the pigment to be incorporated be properly adjusted.

(Sandblasting Method)

Sandblasting method is a method which comprises projecting an abrasive material having a small grain size onto the surface of a polymer film at a high rate to roughen the surface of the film. Sandblasting may be carried out by any known method. For example, carborandum (silicon carbide powder), metal particles or the like can be vigorously blown onto the surface of a film with compressed air. The film thus treated is washed with water, and then dried to accomplish the purpose. The control over the central line average surface roughness of film by sandblasting can be adjusting the particle diameter of the particles to be blown and the amount of the film to be treated (frequency of treatment per unit area). The greater the particle diameter of the particles is or the amount of the film to be treated is, the greater is the central line average surface roughness of the film.

More particularly, sandblasting comprises blowing an abrasive material onto the surface of a film with compressed air to effect surface treatment. The roughness thus formed is adjusted under sandblasting conditions.

Referring to sandblasting conditions, an abrasive is blown onto a film through a sandblast blowing nozzle. It is necessary that the blown amount of abrasive (amount of blast) and the angle and gap between the sandblast blowing nozzle and the film (blast angle, blast distance) be adjusted. Compressed air supplied from an air chamber allows an abrasive in a hopper to be blown through a sandblast blowing nozzle onto the surface of a film so that the film is sandblasted under optimized conditions. These methods are described in detail as known methods in Japanese Patent Laid-Open No. 1996-34866, Japanese Patent Laid-Open No. 1999-90827, and Japanese Patent Laid-Open No. 1999-254590.

Referring to sandblasting conditions, it is necessary that neither abrasive nor abraded material be left on the surface of the film after treatment and the strength of the film be not lowered. These sandblasting conditions can empirically be properly predetermined.

In some detail, as the abrasive there may be used silica sand or other abrasives. In particular, silica sand having a particle diameter of from 0.05 mm to 10 mm, preferably from 0.1 mm to 1 mm is preferably used. The blast distance is preferably from 10 to 1 mm to 300 mm, and the blast angle is preferably from 45 to 90 degrees, more preferably from 45 to 60 degrees. The amount of blast is preferably from 1 to 10 kg/min. Under these sandblasting conditions, neither abrasive nor abraded material can be left on the surface of the polyimide film and the depth of abrasion can be controlled. It is preferred that the depth of abrasion be limited to a range of from 0.01 $\mu$m to 0.1 $\mu$m to prevent the drop of strength of film.

[Plate-making Method]

The method for the preparation of the lithographic printing plate precursor will be described. Imagewise heat-sensitive recording can be directly made on this lithographic printing plate precursor using a thermal recording head. Further, this lithographic printing plate precursor can exposed to infrared rays having a wavelength range of from 760 nm to 1,200 nm from solid laser or semiconductor laser or high illumination flash light from xenon discharge lamp or subjected to photo-heat conversion process exposure to infrared rays from infrared lamp.

Image writing may be effected in either face exposure process or scanning process. In the former case, a process involving irradiation with infrared rays or a process which comprises irradiating the printing precursor with a high illumination short-term light from xenon discharge lamp to cause photo-heat conversion that causes heat generation. In the case where a face exposing light source such as infrared lamp is used, the desired exposure varies with illumination. In practice, however, it is preferred that the face exposure before modulation by printing image be from 0.1 $J/cm^2$ to 10 $J/cm^2$, more preferably from 0.1 $J/cm^2$ to 1 $J/cm^2$. In the case where the support is transparent, the printing plate precursor may be exposed to light on the support side thereof. The exposure time is from 0.01 msec to 1 msec, preferably from 0.01 msec to 0.1 msec. The illumination of exposing light is preferably predetermined to provide the above defined exposure intensity in this exposure time. In the case where the irradiation time is long, the competition relationship between the rate of production of heat energy and the rate of diffusion of heat energy thus produced makes it necessary to increase the exposure intensity.

In the latter case, a process which comprises scanning the printing plate precursor with laser beam containing much infrared components which has been modulated by image is employed. Examples of the laser source employable herein include semiconductor laser, helium neon laser, helium cadmium laser, and YAG laser. The printing plate precursor can be irradiated with laser beam having an output of from 0.1 to 300 W. In the case where a pulse laser is used, the printing plate precursor is preferably irradiated with laser beam having an output of 1,000 W, more preferably 2,000 W. In this case, the exposure is preferably such that the face exposure intensity before modulation with printing image be from 0.1 J/cm$^2$ to 10 J/cm$^2$, more preferably 0.3 J/cm$^2$ to 1 J/cm$^2$. In the case where the support is transparent, the printing plate precursor may be exposed to light on the support side thereof.

In order to make a lithographic printing plate, imagewise exposure is optionally often followed by a step called "gumming" which comprises coating the printing plate with a surface adjust or containing a plate surface protective agent (so-called gum solution) for protecting the non-image area. The lithographic printing plate precursor produced according to the method of the invention can be simply subjected to plate making on the printing machine for printing purpose and thus doesn't require treatment with surface adjustor. However, the lithographic printing plate precursor may be treated with surface adjustor instead of treatment with fountain solution. The treatment with surface adjustor is effected for various purposes such as of preventing the drop of hydrophilicity of the hydrophilic surface due to the effect of a slight amount of contaminants from air, enhancing the hydrophilicity of the non-image area, preventing the deterioration of the lithographic printing plate until printing after plate making or during the period between suspension of printing and resumption of printing, preventing stain on the lithographic printing plate due to the attachment of finger oil or ink to the lithographic printing plate during its handling as in mounting on the printing machine which renders the non-image area ink-receptive and preventing damage on the non-image area or image area during handing of lithographic printing plate.

Specific preferred examples of the film-forming water-soluble resin to be used in the invention include gum arabic, cellulose derivative (e.g., carboxymethyl cellulose, carboxyethyl cellulose, methyl cellulose), modification product thereof, polyvinyl alcohol, derivative thereof, polyvinyl pyrrolidone, polyacrylamide, copolymer thereof, acrylic acid copolymer, vinyl methyl ether-maleic anhydride copolymer, vinyl acetate-maleic anhydride copolymer, styrene-maleic anhydride copolymer, calcined dextrin, enzymatically-decomposed dextrin, and enzymatically-decomposed etherified dextrin.

The content of the aforementioned water-soluble resin in the protective agent in the surface conditioner is preferably from 3% to 25% by mass, more preferably from 10% to 25% by mass. In the invention, the aforementioned water-soluble resins may be used in admixture of two or more thereof.

The surface protective agent for lithographic printing plate may further comprise various surface active agents incorporated therein. Examples of the surface active agent employable herein include anionic surface active agent, and nonionic surface active agent. Examples of the anionic surface active agent include aliphatic alcohol sulfuric acid ester, tartaric acid, malic acid, lactic acid, levulinic acid, and organic sulfonic acid. As mineral acid there may be used nitric acid, sulfuric acid, phosphoric acid or the like. Mineral acids, organic acids or inorganic salts may be used singly or in combination of two or more thereof.

Besides the aforementioned ingredients, lower polyvalent alcohols such as glycerin, ethylene glycol and triethylene glycol may be used as wetting agents as necessary. The amount of these wetting agents to be used is preferably from 0.1% to 5.0% by mass, more preferably from 0.5% to 3.0% by mass based on the protective agent. The surface protective agent for lithographic printing plate may comprise a preservative or the like incorporated therein besides the aforementioned ingredients. For example, benzoic acid, derivative thereof, phenol, formalin, sodium dehydro acetate or the like may be added in an amount of from 0.005% to 2.0% by mass. The surface protective agent may comprise an antifoaming agent incorporated therein. A preferred antifoaming agent may comprise an organic silicone compound incorporated therein preferably in an amount of from 0.0001% to 0.1% by mass.

EXAMPLES

The precursor of the invention and the printing method using same will be further described in the following examples, but the invention should not be construed as being limited thereto. The term"parts" and "%" as used hereinafter are by mass unless otherwise specified. For the measurement of dried solid content ratio, about 1 g of a sample solution was measured out. The sample solution was dried at 120° C. for 1 hour, and then measured for weight. The ratio of dried weight to initial weight was then calculated to determine the dried solid content ratio. The number-average molecular weight was measured by GPC and represented by molecular weight as calculated in terms of polystyrene. For the measurement of acid value, a predetermined amount of a sample solution was measured out, and then titrated with a methanol solution of potassium hydroxide having a known concentration. For the measurement of particle diameter, a Type ELS-800 laser doppler particle size distributor meter produced by Otsuka Electronics Co.,Ltd. was used.

<Preparation of PET Support>

A PET base having a thickness of 188 μm (Cester, produced by Toyobo co., Ltd.) was matted on one side thereof by sandblasting to obtain a surface roughness of 0.32 μm (represented by Ra).

<Preparation of Undercoat Layer>

A coating solution having the following composition was prepared. The coating solution thus prepared was then applied to the aforementioned PET base to a thickness of 1.0 g/m$^2$ to prepare a support.

| | |
|---|---|
| Methanol silica (30 wt-% methanol dispersion, produced by Nissan Chemical Industries, Ltd.) | 0.75 g |
| Titanium dioxide dispersion set forth below (solid content: 27%) | 1.20 g |
| Sol-gel adjustor set forth below | 0.66 g |
| 4% Aqueous solution of PVA117 (Saponification degree: 98.5% PVA, produced by KURARAY CO., LTD.) | 0.38 g |
| 3% Aqueous solution of S-113 (fluorine-based surface active agent produced by Asahi Glass Co., Ltd.) | 0.25 g |
| Methanol | 2.93 g |
| Water | 8.65 g |

Titanium Dioxide Dispersion

A dispersion having the following formulation was put in a 100 ml glass bottle. Glass beads having a diameter of 3 mm were then put in the glass bottle. The glass bottle was then shaken by means of a paint shaker for 20 minutes so that the dispersion was stirred and dispersed.

| | |
|---|---|
| Titanium dioxide powder (rutile type produced by Aldrich Inc.) | 6.00 g |
| 4% Aqueous solution of PVA117 (saponification degree: 98.5% PVA, produced by Kuraray Co., Ltd.) | 15.00 |
| Water | 3.00 g |

Sol-gel Adjustor
(Sol-gel adjustor: ripened at room temperature for 2 hours)

| | |
|---|---|
| Tetramethoxysilane (LS540, produced by Shin-Etsu Silicone Co., Ltd.) | 8.47 g |
| Methanol | 1.82 g |
| Water | 14.5 g |
| 0.1 mol/l malic acid | 0.28 g |

<Coating of Image-recording Layer>

Preparation of Hydrophobicizing Precursor (A)

30 g of a polymethyl methacrylate and 0.5 g of Vionin A41C (produced by TAKEMOTO OIL & FAT CO.,LTD.) were dissolved in a mixture of 75.0 g of ethyl acetate and 30.0 g of methyl ethyl ketone as oil phase components. 100 g of a 4% aqueous solution of PVA205 (saponification degree: 88%, produced by Kuraray Co., Ltd.) was prepared as an aqueous phase component. The oil phase component and the aqueous phase component were then subjected to emulsion at 10,000 rpm by means of a homogenizer. Thereafter, to the mixture was added 80 g of water. The mixture was then stirred for 30 minutes at room temperature and for 3 hours at a temperature of 40° C. The fine dispersion of polymer thus obtained had a solid content concentration of 16% and an average particle diameter of 0.23 μm.

Synthesis of Hydrophilic Polymer (P-1) Terminated by Silane Coupling Group

In a three-necked flask were charged 25 g of acrylamide, 3.5 g of 3-mercaptopropyl trimethoxysilane and 51.3 g of dimethyl formamide. In a stream of nitrogen, the contents of the flask were heated to a temperature of 65° C. where 0.25 g of 2,2'-azobis(2,4-dimethylvaleronitrile) was then added thereto to initiate reaction. The reaction mixture was stirred for 6 hours. The temperature of the reaction mixture was then returned to room temperature. The reaction mixture was then put in 1.5 l of ethyl acetate. As a result, a solid material was precipitated. Thereafter, the precipitate was withdrawn by filtration, thoroughly washed with ethyl acetate, and then dried (yield: 21 g). GPC (polystyrene standard) showed that the product is a polymer having a weight-average molecular weight of 5,000.

Sol-gel Adjustor

To 5.12 g of purified water and 8.14 g of ethyl alcohol were added 1.23 g of tetramethoxysilane (LS-540, produced by Shin-Etsu Silicone Co., Ltd.), 2.04 g of particulate colloidal silica (Snowtex C (20% $H_2O$), produced by Nissan Chemical Industries, Ltd.), 10.2 g of a 4 wt-% aqueous solution of the aforementioned hydrophilic polymer terminated by silane coupling group, and metal complex catalyst or comparative catalyst set forth in Table 1 in an amount set forth in Table 1, respectively. The mixture was then stirred at a temperature of 60° C. for 2 hours. Thereafter, the mixture was allowed to cool to room temperature to obtain a sol-gel adjustor.

Coating

An aqueous coating solution having the following composition was prepared. The aqueous coating solution thus prepared was applied to the aforementioned exothermic layer by means of a bar coater in an amount such that the mass of the dried film was 3.0 g/m$^2$, dried at a temperature of 60° C. in an oven for 10 minutes, and then subjected to post-heating at a temperature of 55° C. and 60%RH.

Composition of Image-recording Layer Coating Solution

| | |
|---|---|
| 4% Aqueous solution of anionic surface active agent (NIKKOL OTP-100s, produced by Nikko Chemicals Co., Ltd.) | 0.24 g |
| Sol-gel adjustor set forth above | 4.45 g |
| 11% Aqueous solution of hydrophobicizing precursor A | 5.04 g |
| 1.5% Aqueous solution of infrared-absorbing dye (1) set forth below | 4.8 g |
| Water | 1.6 g |

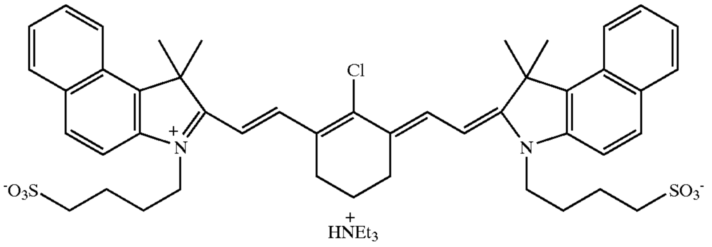

<Image Formation>

Using a Type 3244VFS trend setter (produced by CREO Co., Ltd.) having a water-cooled 40 W infrared semiconductor laser, the lithographic printing plate precursor was exposed to light at an output of 12 W, an external drum rotary speed of 94 rpm, a plate surface energy of 300 mJ/cm$^2$ and a resolution of 2,400 dpi to form a heat-fused image area on the surface of the exposed area. The printing plate precursor thus processed was then subjected to plate-making process without being developed.

<Printing>

As a printing machine there was used RYOBI3200MCD. As a fountain solution there was used a 1 vol-% aqueous solution of EU-3 (produced by Fuji Photo Film Co., Ltd.). As an ink there was used GEOS(N) Black (produced by DAINIPPON INK & CHEMICALS, INC.). The results of evaluation of image formed, contact angle of film and print quality are set forth in Table 1. The press life as set forth in Table 1 indicates the number of sheets which allow printing without print stain. In the present example, printing was made on 50,000 sheets of paper. Therefore, the press life should be considered to be "50,000 sheets or more". However, the term"or more" is omitted. The evaluation of background stain, contact angle and hardness were conducted in the following manner.

Background stain: Printing was made with an ink in an ordinary manner except that the amount of fountain solution was reduced as compared with the normal balance of ink/fountain solution (water graduation: 3 or less). The degree of attachment of ink of non-image area to the printed area was then organoleptically evaluated in accordance with the following 3-step criterion:

(G: good; F: slightly stained on the background; P: Vigorously stained on the background)

Contact angle: Using a Type CA-D contact analyzer (produced by Kyowa Interface Science Co., Ltd.), the angle of contact with respect to water droplet was measured 1 minute after dropping by an air-water droplet method.

Stability of coating solution: The coating solution was heated to a temperature of 50° C. where it was then measured for change of viscosity with time by means of a B-type viscometer.

(G: No change for 3 days; F: No change for 1 day; P: Gelled in 6 hours)

Dynamic hardness: Measured by means of a dynamic ultra micro hardness tester. (Test load: 2.0 mN; loading speed: 0.236994 mN/sec; shape of indenter: 115)

The dynamic hardness is hardness determined by the load developed when the indenter is pressed into the specimen and the depth of indentation. This is a material strength including plastic deformation as well as elastic deformation of specimen. Supposing that the test load is P (mN) and the penetration of the indenter into the specimen (depth of indentation) is D ($\mu$m), the dynamic hardness DH is defined by the following equation:

$$DH=\alpha P/D^2$$

wherein $\alpha$ is a constant determined by the shape of the indenter which is 3.8584 (in the case of indenter 115).

<Results>

The kind and added amount of the catalyst and the results of test are set forth altogether in Table 1.

background stain can be obtained, but the coating solution leaves something to be desired in stability and the coat layer has a lowered hardness. This is presumably because phosphoric acid is a weak acid. In Comparative Example 4, sol-gel reaction under alkaline conditions was at tempted using ammonia. However, dehydration condensation reaction after hydrolysis could not be controlled, causing gelation in the coating solution and hence making it impossible to obtain satisfactory coat conditions. On the other hand, when $Al(acac)_3$ was used, a high age stability of coating solution and a high hardness of coat layer could be realized. This effect is presumably attributed to the stability attained by an organic metal complex of aluminum and acetyl acetone in the coating solution and the acceleration of dehydration condensation of sol-gel by the alkalinically catalytic activity of this complex during drying. As a result, a good hydrophilicity, water retention and hardness can be attained by the microphase separation structure of the hydrophilic binder having a silane coupling group, making it possible to form a lithographic printing plate precursor having a press life of 50,000 sheets or more and an excellent stain resistance.

Once exposed to light, the lithographic printing plate precursor of the invention having a heat-hydrophobicizable hydrophilic layer comprising a particulate hydrophobicizing precursor, a photo-heat converting agent, a hydrophilic polymer having a silane coupling group and a specific organic metal complex catalyst provided on a support can be used in printing without being developed. The lithographic printing plate precursor of the invention has an improved press life and is little subject to background stain. In accordance with the invention, there are improvements also in stability of coating solution and quality of coated surface.

The entire disclosure of each and every foreign patent application from which the benefit of foreign priority has been claimed in the present application is incorporated herein by reference, as if fully set forth.

TABLE 1

| Example No. | Catalyst | Amount of catalyst | pH value of coating solution (25° C.) | Stability of coating solution | Dynamic hardness | Background stain | Press life |
|---|---|---|---|---|---|---|---|
| Comparative Example 1 | Nitric acid (1N) | 0.90 g | 2.10 | P | 29.4 | G | 20,000 sheets |
| Comparative Example 2 | Nitric acid (1N) | 0.10 g | 3.58 | G | 26.0 | F | 12,000 sheets |
| Comparative Example 3 | Phosphoric acid (1N) | 0.90 g | 3.01 | F | 27.0 | G | 15,000 sheets |
| Comparative Example 4 | $NH_4OH$ (1N) | 0.65 g | 9.10 | P | 32.0 | P | — |
| Example 1 | $Al(acac)_3$ | 0.15 g | 4.44 | G | 44.7 | G | >20,000 sheets |
| Example 2 | $Al(acac)_3$ | 0.22 g | 4.48 | G | 45.8 | G | >20,000 sheets |

Results

The results of Comparative Examples 1 and 2 show that in the case where nitric acid is used as a catalyst, when the amount of the catalyst increases, the stability of the coating solution deteriorates even if the hardness increases. It is also shown that there is no range of added amount of catalyst within which both the desired hardness and coating solution stability can be satisfied. Further, when the amount of the nitric acid catalyst is insufficient, no microphase separation appears, making it impossible to obtain an effective water retention and hence causing background stain.

The results of Comparative Example 3 shows that when phosphoric acid is used as a catalyst, some resistance to

What is claimed is:

1. A lithographic printing plate precursor comprising a support and a hydrophilic layer capable of hydrophobicizing by heat, wherein the hydrophilic layer comprises:

a particulate hydrophobicizing precursor;

a photo-heat converting agent;

a hydrophilic polymer having a terminal silane coupling group, and a metal complex catalysts, wherein the hydrophilic nolymer is a polymer represented by the following general formula (1-1):

(1-1)

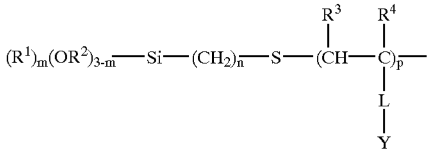

wherein $R^1$, $R^2$, $R^3$ and $R^4$ each independently represents a hydrogen atom or a hydrocarbon groud having 8 or less carbon atoms, m represents an inteaer of 0 to 2, n represents an integer of from 1 to 8, p represents an inteaer of from 30 to 300, Y represents $—NHCOCH_3$, $—CONH_2$, $—CON(CH_3)_2$, $—COCH_3$, —OH, $—CO_2M$ or $—CONHC(CH_3)_2SO_3M$, M represents a hydrogen atom, an alkaline metal, an alkaline earth metal or onium, and L represents a single bond or an organic connectina group.

2. The lithographic printing plate precursor according to claim 1, wherein the metal complex catalyst is ametal complex composed of: a metal element selected from the group consisting of elements belonging to the groups 2A, 3B, 4A and 5A; and an oxo or hydroxyoxygen-containing compound selected from the group consisting of β-diketone, ketoester, hydroxycarboxylic acid, ester of hydroxycarboxylic acid, aminoalcohol, enolic active hydrogen compound and acetyl acetone derivative.

3. The lithographic printing plate precursor according to claim 2, wherein the metal element constituting the metal complex catalyst is a metal element selected from the group consisting of Zr, Ti and Al.

4. The lithographic printing plate precursor according to claim 2, wherein the acetyl acetone derivative constituting the metal complex catalyst is acetylacetoile or diacetylacetone.

5. The lithographic printing plate precursor according to claim 1, wherein the metal complex catalyst is a mononuclear complex having from 1 to 4 acetylacetone derivative molecules per one metal element.

6. The lithographic printing plate precursor according to claim 1, wherein the metal complex catalyst is a tris (acetylacetonato) aluminum complex salt represented by the following general formula (1):

(1)

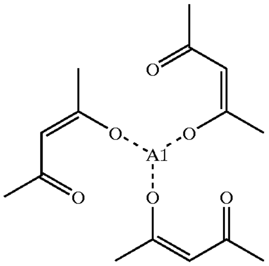

7. The lithographic printing plate precursor according to claim 1, which further comprises solid particles.

8. A lithographic printing plate precursor comprising a support and a hydrophilic layer capable of hydrophobicizing by heat, wherein the hydrophilic layer comprises:

a particulate hydrophobicizing precursor;

a photo-heat converting agent;

a hydrophilic polymer having a silane coupling group, and a metal complex catalyst, wherein the metal complex catalyst is a metal complex composed of: a metal element selected from the group consisting of elements belonging to the groups 2A, 3B, 4A and 5A; and an oxo or hydroxyoxygen-containing compound selected from the group consisting of β-diketone, ketoester, hydroxycarboxylic acid, ester of hydroxycarboxylic acid, aminoalcohol, enolic active hydrogen compound and acetyl acetone derivative, and the acetyl acetone derivative is acetylacetone having a substituent on at least one carbon atom of the methyl group, the methylene group or the carbonyl carbon.

* * * * *